United States Patent
Chillara et al.

(10) Patent No.: US 11,264,949 B2
(45) Date of Patent: Mar. 1, 2022

(54) APPARATUS AND METHODS FOR ROTARY TRAVELING WAVE OSCILLATORS

(71) Applicant: Analog Devices International Unlimited Company, Limerick (IE)

(72) Inventors: Vamshi Krishna Chillara, Raheen (IE); Declan D. Dalton, Ballyneety (IE); Colin G. Lyden, Baltimore (IE); Hyman Shanan, Franklin Park, NJ (US)

(73) Assignee: Analog Devices International Unlimited Company, Limerick (IE)

(*) Notice: Subject to any disclaimer, the term of this patent is extended or adjusted under 35 U.S.C. 154(b) by 0 days.

(21) Appl. No.: 17/303,215

(22) Filed: May 24, 2021

(65) Prior Publication Data

US 2021/0391828 A1 Dec. 16, 2021

Related U.S. Application Data

(60) Provisional application No. 62/705,096, filed on Jun. 10, 2020.

(51) Int. Cl.
  *H03B 27/00* (2006.01)
  *H03K 3/03* (2006.01)
  (Continued)

(52) U.S. Cl.
  CPC ........... *H03B 5/1841* (2013.01); *H03B 27/00* (2013.01); *H03K 3/0322* (2013.01);
  (Continued)

(58) Field of Classification Search
  CPC ........ H03B 5/1841; H03B 5/26; H03B 27/00; H03B 2200/0016; H03B 2201/0208; H03K 3/0315; H03K 3/0322
  See application file for complete search history.

(56) References Cited

U.S. PATENT DOCUMENTS 3,516,021 A   6/1970   Kohn
3,538,450 A   11/1970  Andrea et al.
(Continued)

FOREIGN PATENT DOCUMENTS

CN   102624334 A   8/2012
DE   4322701 C1   8/1994
(Continued)

OTHER PUBLICATIONS

Abbasaozadeh, Soolmaz, "Thermal and flicker phase noise analysis in rotary traveling-wave oscillator," International Journal of Circuit Theory and Applcations, Jul. 2019.
(Continued)

*Primary Examiner* — Levi Gannon
(74) *Attorney, Agent, or Firm* — Knobbe, Martens, Olson & Bear, LLP

(57) ABSTRACT

Apparatus and methods for rotary traveling wave oscillators (RTWOs) are disclosed. In certain embodiments, an RTWO system include an RTWO ring that carries a traveling wave, a plurality of selectable capacitors distributed around the RTWO ring and each operable in a selected state and an unselected state, and a decoder system that controls selection of the plurality of selectable capacitors based on a frequency tuning code. The frequency tuning code includes a fine tuning code and a coarse tuning code, and the decoder system is operable to maintain a constant number of capacitors that toggle state for each value of the fine tuning code.

20 Claims, 25 Drawing Sheets

(51) Int. Cl.
*H03B 5/18* (2006.01)
*H03L 7/099* (2006.01)

(52) U.S. Cl.
CPC .... *H03L 7/0995* (2013.01); *H03B 2200/0016* (2013.01); *H03B 2201/0208* (2013.01); *H03L 2207/50* (2013.01)

(56) References Cited

U.S. PATENT DOCUMENTS

| | | |
|---|---|---|
| 4,246,550 A | 1/1981 | Cohen |
| 4,246,555 A | 1/1981 | Williams |
| 4,514,707 A | 4/1985 | Dydyk et al. |
| 4,686,407 A | 8/1987 | Ceperley |
| 4,749,963 A | 6/1988 | Makimoto et al. |
| 4,875,046 A | 10/1989 | Lewyn |
| 5,117,206 A | 5/1992 | Imamura |
| 5,235,335 A | 8/1993 | Hester et al. |
| 5,302,920 A | 4/1994 | Bitting |
| 5,331,294 A | 7/1994 | Watanabe et al. |
| 5,361,277 A | 11/1994 | Grover |
| 5,493,715 A | 2/1996 | Humphreys et al. |
| 5,546,023 A | 8/1996 | Borkar et al. |
| 5,584,067 A | 12/1996 | V. Buer et al. |
| 5,592,126 A | 1/1997 | Boudewijns et al. |
| 5,640,112 A | 6/1997 | Goto et al. |
| 5,652,549 A | 7/1997 | Unterricker et al. |
| 5,754,833 A | 5/1998 | Singh et al. |
| 5,825,211 A | 10/1998 | Smith et al. |
| 5,945,847 A | 8/1999 | Ransijn |
| 5,963,086 A | 10/1999 | Hall |
| 5,973,633 A | 10/1999 | Hester |
| 6,002,274 A | 12/1999 | Smith et al. |
| 6,078,202 A | 6/2000 | Tomatsuri et al. |
| 6,133,798 A | 10/2000 | Nagano et al. |
| 6,150,886 A | 11/2000 | Shimomura |
| 6,157,037 A | 12/2000 | Danielson |
| 6,239,663 B1 | 5/2001 | Mizutani |
| 6,249,189 B1 | 6/2001 | Wu et al. |
| 6,259,327 B1 | 7/2001 | Balistreri et al. |
| 6,259,747 B1 | 7/2001 | Gustafsson et al. |
| 6,281,759 B1 | 8/2001 | Coffey |
| 6,323,737 B1 | 11/2001 | Broekaert |
| 6,396,359 B1 | 5/2002 | Hajimiri et al. |
| 6,426,662 B1 | 7/2002 | Arcus |
| 6,525,618 B2 | 2/2003 | Wood |
| 6,556,089 B2 | 4/2003 | Wood |
| 6,566,968 B2 | 5/2003 | Aghahi |
| 6,574,288 B1 | 6/2003 | Welland et al. |
| 6,683,503 B2 | 1/2004 | Mizuno et al. |
| 6,781,424 B2 | 8/2004 | Lee et al. |
| 6,816,020 B2 | 11/2004 | Wood |
| 6,856,208 B2 | 2/2005 | Lee et al. |
| 6,870,431 B2 | 3/2005 | Afghahi |
| 6,900,699 B1 | 5/2005 | Kim |
| 6,909,127 B2 | 6/2005 | O'Mahony et al. |
| 6,943,599 B2 | 9/2005 | Ngo |
| 6,995,620 B2 | 2/2006 | Afghahi |
| 7,005,930 B1 | 2/2006 | Kim et al. |
| 7,085,668 B2 | 8/2006 | Johnson |
| 7,088,154 B2 | 8/2006 | Ngo |
| 7,091,802 B2 | 8/2006 | Ham et al. |
| 7,130,604 B1 | 10/2006 | Wong et al. |
| 7,203,914 B2 | 4/2007 | Wood |
| 7,209,065 B2 | 4/2007 | Wood |
| 7,224,199 B1 | 5/2007 | Kang |
| 7,224,235 B2 | 5/2007 | De Ranter et al. |
| 7,236,060 B2 | 6/2007 | Wood |
| 7,242,272 B2 | 7/2007 | Ham et al. |
| 7,274,262 B2 | 9/2007 | Ham et al. |
| 7,280,001 B2 | 10/2007 | Maligeorgos et al. |
| 7,295,076 B2 | 11/2007 | Kim et al. |
| 7,307,483 B2 | 12/2007 | Tzartzanis et al. |
| 7,315,219 B2 | 1/2008 | Chiang |
| 7,339,439 B2 | 3/2008 | Roubadia et al. |
| 7,378,893 B1 | 5/2008 | Kang |
| 7,397,230 B2 | 7/2008 | Tabaian et al. |
| 7,409,012 B2 | 8/2008 | Martin et al. |
| 7,439,777 B2 | 10/2008 | Wood |
| 7,446,578 B2 | 11/2008 | Huang |
| 7,471,153 B2 | 12/2008 | Kee et al. |
| 7,482,884 B2 | 1/2009 | Wang et al. |
| 7,504,895 B2 | 3/2009 | Neidorff |
| 7,511,588 B2 | 3/2009 | Gabara |
| 7,513,873 B2 | 4/2009 | Shifrin |
| 7,515,005 B2 | 4/2009 | Dan |
| 7,541,794 B2 | 6/2009 | Tabaian et al. |
| 7,545,225 B2 | 6/2009 | Beccue |
| 7,551,038 B2 | 6/2009 | Jang et al. |
| 7,571,337 B1 | 8/2009 | Zhai et al. |
| 7,577,225 B2 | 8/2009 | Azadet et al. |
| 7,609,756 B2 | 10/2009 | Wood |
| 7,612,621 B2 | 11/2009 | Kim et al. |
| 7,616,070 B2 | 11/2009 | Tzartzanis et al. |
| 7,656,239 B2 | 2/2010 | Bietti et al. |
| 7,656,336 B2 | 2/2010 | Wood |
| 7,656,979 B2 | 2/2010 | Leydier et al. |
| 7,663,328 B2 | 2/2010 | Gonder |
| 7,715,143 B2 | 5/2010 | Bliss et al. |
| 7,741,921 B2 | 6/2010 | Ismailov |
| 7,782,988 B2 | 8/2010 | Ziesler |
| 7,805,697 B2 | 9/2010 | Wood |
| 7,812,648 B2 | 10/2010 | Wood |
| 7,833,158 B2 | 11/2010 | Bartz |
| 7,847,643 B2 | 12/2010 | Da Dalt |
| 7,885,625 B2 | 2/2011 | Muhammad et al. |
| 7,893,778 B2 | 2/2011 | Mohtashemi et al. |
| 7,907,023 B2 | 3/2011 | Liang et al. |
| 7,911,284 B2 | 3/2011 | Kuwano |
| 7,924,076 B2 | 4/2011 | Suzuki et al. |
| 7,936,193 B2 | 5/2011 | Van Der Wel et al. |
| 7,944,316 B2 | 5/2011 | Watanabe et al. |
| 7,952,439 B1 | 5/2011 | Heggemeier et al. |
| 7,973,609 B2 | 7/2011 | Ohara et al. |
| 7,978,012 B2 | 7/2011 | Wood |
| 7,995,364 B2 | 8/2011 | Shiu |
| 8,008,981 B2 | 8/2011 | Hong et al. |
| 8,049,563 B2 | 11/2011 | Aoki et al. |
| 8,089,322 B2 | 1/2012 | Martchovsky et al. |
| 8,115,560 B2 | 2/2012 | Chung |
| 8,169,267 B2 | 5/2012 | De Mercey |
| 8,193,870 B2 | 6/2012 | Takinami et al. |
| 8,410,858 B2 | 4/2013 | Wood |
| 8,581,759 B2 | 11/2013 | Booth et al. |
| 8,629,807 B2 | 1/2014 | Wood et al. |
| 8,669,818 B2 | 3/2014 | Le Grand De Mercey |
| 8,742,857 B2 | 6/2014 | Martchovsky et al. |
| 8,895,913 B2 | 11/2014 | Tekin et al. |
| 9,191,020 B2 | 11/2015 | Tekin et al. |
| 9,209,745 B2 | 12/2015 | Beccue |
| 9,473,069 B1 | 10/2016 | Beccue |
| 9,838,026 B2 | 12/2017 | Van Brunt |
| 10,277,233 B2 | 4/2019 | Shanan |
| 10,312,922 B2 | 6/2019 | Shanan |
| 10,756,741 B2 | 8/2020 | Shanan |
| 2003/0128075 A1 | 7/2003 | Wood |
| 2003/0151465 A1 | 8/2003 | Wood |
| 2004/0233022 A1 | 11/2004 | Tsuzuki et al. |
| 2005/0068116 A1 | 3/2005 | Ham |
| 2005/0225365 A1 | 10/2005 | Wood |
| 2006/0208776 A1 | 9/2006 | Tonietto et al. |
| 2008/0074202 A1 | 3/2008 | Gabara |
| 2008/0252386 A1 | 10/2008 | Kim |
| 2009/0215423 A1 | 8/2009 | Hwang et al. |
| 2009/0273403 A1* | 11/2009 | Ismailov ............... H03L 7/00 331/55 |
| 2009/0322394 A1 | 12/2009 | Song et al. |
| 2010/0066416 A1 | 3/2010 | Ohara et al. |
| 2010/0117744 A1 | 5/2010 | Takinami et al. |
| 2010/0156549 A1 | 6/2010 | Uemura et al. |
| 2010/0321121 A1 | 12/2010 | Mohtashemi |
| 2011/0095833 A1 | 4/2011 | Mohtashemi et al. |
| 2011/0156760 A1 | 6/2011 | Bhuiyan et al. |
| 2011/0156773 A1 | 6/2011 | Beccue |
| 2011/0195683 A1 | 8/2011 | Brekelmans et al. |

(56) References Cited

U.S. PATENT DOCUMENTS

| | | |
|---|---|---|
| 2011/0286510 A1 | 11/2011 | Levantino et al. |
| 2012/0008717 A1 | 1/2012 | van Sinderen et al. |
| 2012/0013363 A1 | 1/2012 | Takinami et al. |
| 2012/0013407 A1 | 1/2012 | Takinami et al. |
| 2012/0025918 A1 | 2/2012 | Wang et al. |
| 2012/0112841 A1 | 5/2012 | Hayashi |
| 2012/0185623 A1 | 7/2012 | Ross et al. |
| 2012/0212297 A1 | 8/2012 | Le Grand De Mercey et al. |
| 2013/0151465 A1 | 6/2013 | Baumgaertel |
| 2013/0154750 A1 | 6/2013 | Martchovsky |
| 2013/0271190 A1 | 10/2013 | Booth et al. |
| 2016/0204764 A1 | 7/2016 | Ferriss |
| 2018/0102781 A1 | 4/2018 | Shanan |
| 2018/0102782 A1* | 4/2018 | Shanan ............... H03B 5/1841 |
| 2021/0091721 A1 | 3/2021 | Shehata et al. |

FOREIGN PATENT DOCUMENTS

| | | |
|---|---|---|
| EP | 0633662 A1 | 1/1995 |
| EP | 0696843 A1 | 2/1996 |
| EP | 0478134 B1 | 6/1997 |
| EP | 0583839 A1 | 11/1997 |
| EP | 0891045 B1 | 1/2002 |
| EP | 2506424 A2 | 10/2012 |
| GB | 1247199 | 9/1971 |
| GB | 2358562 | 7/2001 |
| JP | 60224205 | 11/1985 |
| JP | 4165809 | 6/1992 |
| WO | WO 95/12263 | 5/1995 |
| WO | WO 00/44093 | 7/2000 |
| WO | WO 2006/091826 A2 | 8/2006 |

OTHER PUBLICATIONS

Bubmann et al., "Active Compensation of Interconnect Losses of Multi-GHz Clock Distribution Networks," IEEE Transactions on Circuits and Systems-II: Analog and Digital Signal Processing, vol. 39, No. 11, Nov. 1992, pp. 790-798.

Cathcart, E., "A Rotary Travelling Wave Oscillator Based All-Digital PLL In 65nm CMOS" dated 2017, in 146 pages.

Chen, et al., "Rotary Traveling-Wave Oscillators, Analysis and Simulation," IEEE Transactions on Circuits and Systems-I: Regular Papers, vol. 58, No. 1, Jan. 2011, in 11 pages.

Chien, et al., "A 32 GHz Rotary Traveling-Wave Voltage Controlled Oscillator in 0.18-µm CMOS," IEEE MWCL, vol. 17, No. 10, pp. 724-726, Oct. 2007.

Deutsch, et al., "Modeling and Characterization of Long On-Chip Interconnections for High-Performance Microprocessors," IBM J Res. Develop., vol. 39, No. 5, Sep. 1995, pp. 547-567.

Divina et al., "The Distributed Oscillator at 4 GHZ," IEEE, Department Electromagnetic Field, May 1998, Czech Technical University in Prague, Technicka 2, 166 27 Praha 6, Czech Republic, pp. 1-4.

Dunning, Jim, "An All-Digital Phase-Locked Loop with 50-Cycle Lock Time Suitable for High-Performance Microprocessors," IEEE Journal of Solid-State Circuits, vol. 30, No. 4, Apr. 1995, pp. 412-422.

Guo, et al., "A 0.083 mm2 25.2-to-29.5 GHz Multi-LC-Trank Class-F234 VCO with a 189.6-dBc/Hz FOM," IEEE Solid State Circuits Letters, vol. 1, Issue 4, Apr. 2018.

Hall, et al., "Clock Distribution Using Cooperative Ring Oscillators," IEEE, Proceedings of the 17th Conference on Advanced Research in VLSI, Ann Arbor, MI (Sep. 15-16, 1997) pp. 62-75.

Hu, et al., "A Low-Flicker-Noise 30-GHz Class-F23 Oscillator in 28-nm CMOS using Implicit Resonance and Explicit Common-Mode Return Path," IEEE Journal of Solid-State Circuits, vol. 53, No. 7, Jul. 2018, in 11 pages.

Kato, Hatsuhiro, "A Dynamic Formulation of Ring Oscillator as Solitary-Wave Propagator," IEEE Transactions on Circuits and Systems-I: Fundamental Theory and Applications, vol. 45, No. 1, Jan. 1998, pp. 98-101.

Kim, et al., "A Low Phase-Noise CMOS LC Oscillator with a Ring Structure," 2000 IEEE International Solid-State Circuits Conference, 3 pages.

Kleveland, B. et al., "Line Inductance Extraction and Modeling in a Real Chip With Power Grid," IEEE IEDM Conference, 1999, Washington, D.C. pp 1-4.

Kleveland, et al., "50 GHz Interconnect Design in Standard Silicon Technology," IEEE MIT-S International Microwave Symposium, Baltimore, Maryland, Jun. 1998, 4 pages.

Kleveland, et al., "Monolithic CMOS Distributed Amplifier and Oscillator," 1999 IEEE International Solid-State Circuits Conference, 1999, 9 pages.

Kral, et al., "RF-CMOS Oscillators With Switched Tuning," Proceedings of the IEEE 1998 Custom Integrated Circuits Conference, pp. 555-558.

Larsson, Hakan, Distributed Synchronous Clocking Using Connected Ring Oscillators, Master's Thesis in Computer Systems Engineering, Centre for Computer Systems Architecture, Halmstad University: Halmstad, Sweden, Technical Report CCA—9705, Jan. 1997, pp. i-43.

Le Grand de Mercey 18GHZ=36GHZ Rotary Traveling Wave VCO in CMOS with I/Q Outputs, 29th European Solid State Circuits Conference, Sep. 2003.

Le Grand de Mercey, Gregoire, 18GHZ=36GHZ Rotary Traveling Wave Voltage Controlled Oscillator in a CMOS Technology, Aug. 2004, in 135 pages.

M.A. Shehata, M.Keaveney and R.B.Staszewski, "A 184.6-dBc/Hz FoM 100-kHz Flicker Phase Noise Corner 30-GHz Rotary Traveling-Wave Oscillator Using Distributed Stubs in 22-nm FD-SOI," ESSCIRC 2019—IEEE 45th European Solid State Circuits Conference (ESSCIRC), Cracow, Poland, 2019, pp. 103-106, doi:10.1109/ESSCIRC.2019.8902916.

M.A. Shehata, M.Keaveney and R.B.Staszewski, "A 184.6-dBc/Hz FoM 100-kHz Flicker Phase Noise Corner 30-GHz Rotary Traveling-Wave Oscillator Using Distributed Stubs in 22-nm FD-SOI," in IEEE Solid-State Circuits Letters, vol. 2, No. 9, pp. 103-106, Sep. 2019, doi:10.1109/LSSC.2019.2929326.

Miller, Brian, "A Multiple Modulator Fractional Divider," IEEE Transactions on Instrumentation and Measurement, vol. 40, No. 3, Jun. 1991, pp. 578-583.

Moroni et al., "Analysis and Design of a 54 GHz Distributed "Hybrid" Wave Oscillator Array with Quadrature Outputs," IEEE Journal of Solid-State Circuits, vol. 49, No. 5, May 2014, in 15 pages.

Nagashino, Hirofumi, et al., "Generation of Traveling Wave Mode in a Chained Neural Oscillator Network Model," IEEE, Proc. of the Int. Conference on Neural Networks (ICNN), New York, Mar. 1993, pp. 1550-1557.

Nouri et al., "A 45-GHz Rotary-Wave Voltage-Controlled Oscillator," IEEE Transactions on Microwave Theory and Techniques, vol. 59, No. 2, Feb. 2011, in 10 pages.

Shehata et al., "A Distributed Stubs Technique to Mitigate Flicker Noise Upconversion in a mm-Wave Rotary Traveling-Wave Oscillator" IEEE Journal of Solid-State Circuits dated Jan. 2021 in 16 pages.

Skvor, Z., et al., "Novel Decade Electronically Tunable Microwave Oscillator Based on the Distributed Amplifier," IEEE Explore, Electronic Letters, vol. 28, No. 17, Aug. 1992, pp. 1647-1648.

Takinami, Koji, "Phase-Noise Analysis in Rotary Traveling Wave Oscillators Using Simple Physical Model," IEEE Transactions on Microwave Theory and Techniques, vol. 58, No. 6, Jun. 2010, in 10 pages.

Vigilante, et al., "A Coupled RTWO-Based Subharmonic Receiver Front End for 5G E-Band Backhaul Links in 28-nm Bulk CMOS," IEEE Journal of Solid State Circuits, vol. 53, No. 10, Oct. 2018, in 12 pages.

Wilson, et al., "A CMOS Self-Calibrating Frequency Synthesizer," IEEE Journal of Solid-State Circuits, vol. 35, No. 10, Oct. 2000, pp. 1437-1444.

Wood et al. "Rotary Traveling-Wave Oscillator Arrays: A New Clock Technology" IEEE Journal of Solid-State Circuits, vol. 36, No. 11 dated Nov. 2001, in 12 pages.

(56) References Cited

OTHER PUBLICATIONS

Wu, et al., "E-Band Multi-Phase LC Oscillators with Rotated-Phase-Tuning Using Implicit Phase Shifters," IEEE JSSC, vol. 53, No. 9, pp. 2560-2571, Sep. 2018.
Yabuki, Hiroyuki, et al., "Miniaturized Stripline Dual-Mode Ring Resonators and Their Application to Oscillating Devices," IEEE MIT-S International Microwave Symposium Digest, New York, May 16. 1995, pp. 1313-1316.
Yue, et al., "On-Chip Spiral Inductors with Patterned Ground Shields for Si-Based RF IC's," IEEE Journal of Solid-State Circuits, vol. 33, No. 5, 1998, pp. 743-752.

\* cited by examiner

| | | | | | | | | | | | | | | | | | |
|---|---|---|---|---|---|---|---|---|---|---|---|---|---|---|---|---|---|
| 6 | 30 | 29 | 28 | 27 | 26 | 25 | 24 | 23 | | 15 | 30 | 29 | 28 | 27 | 26 | 25 | 24 | 23 |

NW 1141

NE 1142

SW 1143

SE 1144

APPARATUS AND METHODS FOR ROTARY TRAVELING WAVE OSCILLATORS

CROSS-REFERENCE TO RELATED APPLICATIONS

The present application claims priority to U.S. Provisional Patent Application No. 62/705,096, filed Jun. 10, 2020, and titled "APPARATUS AND METHODS FOR ROTARY TRAVELING WAVE OSCILLATORS," the entirety of which is hereby incorporated herein by reference.

FIELD OF THE DISCLOSURE

Embodiments of the invention relate to electronic systems, and more particularly, to rotary traveling wave oscillators (RTWOs).

BACKGROUND

Rotary traveling wave oscillators (RTWOs) can be used in a variety of applications, including, for example, telecommunications systems, optical networks, and/or chip-to-chip communication. For instance, an RTWO can be included in a frequency synthesizer to generate an output clock signal having a controlled phase and frequency relationship to a reference clock signal.

SUMMARY OF THE DISCLOSURE

Rotary traveling wave oscillator (RTWO) systems are disclosed herein. In certain embodiments, an RTWO system include an RTWO ring that carries a traveling wave, a plurality of selectable capacitors distributed around the RTWO ring and each operable in a selected state and an unselected state, and a decoder system that controls selection of the plurality of selectable capacitors based on a frequency tuning code. The frequency tuning code includes a fine tuning code and a coarse tuning code, and the decoder system is operable to maintain a constant number of capacitors that toggle state for each value of the fine tuning code. By implementing the RTWO system in this manner, a code dependent frequency error is reduced or eliminated.

In one aspect, an RTWO system includes a first RTWO ring configured to carry a traveling wave, a plurality of selectable capacitors distributed around the first RTWO ring and each of the plurality of selectable capacitors is operable in a selected state and an unselected state, and a decoder system configured to control selection of the plurality of selectable capacitors based on a frequency tuning code including a fine tuning code and a coarse tuning code. The decoder system is configured to maintain a constant number of capacitors that toggle state for each value of the fine tuning code.

In another aspect, a method of method of rotary traveling wave oscillation is provided. The method includes propagating a travelling wave around an RTWO ring, controlling a delay of the travelling wave around the RTWO ring using a plurality of selectable capacitors distributed around the first RTWO ring and each operable in a selected state and an unselected state, controlling selection of the plurality of selectable capacitors based on a frequency tuning code that includes a fine tuning code and a coarse tuning code using a decoder system, and maintaining a constant number of capacitors of the plurality of selectable capacitors that toggle state for each value of the fine tuning code using the decoder system.

In another aspect, an RTWO system includes an RTWO ring configured to carry a traveling wave, a plurality of selectable capacitors distributed around the RTWO ring and each operable in a selected state and an unselected state, and a decoder system configured to control selection of the plurality of selectable capacitors based on a frequency tuning code including a fine tuning code and a coarse tuning code. The decoder system includes means for maintaining a constant number of capacitors that toggle state for each value of the fine tuning code.

BRIEF DESCRIPTION OF THE DRAWINGS

FIGS. 7A and 7B illustrate another implementation of dynamic element matching for segment selection of an RTWO.

DETAILED DESCRIPTION OF EMBODIMENTS

Figure 1:
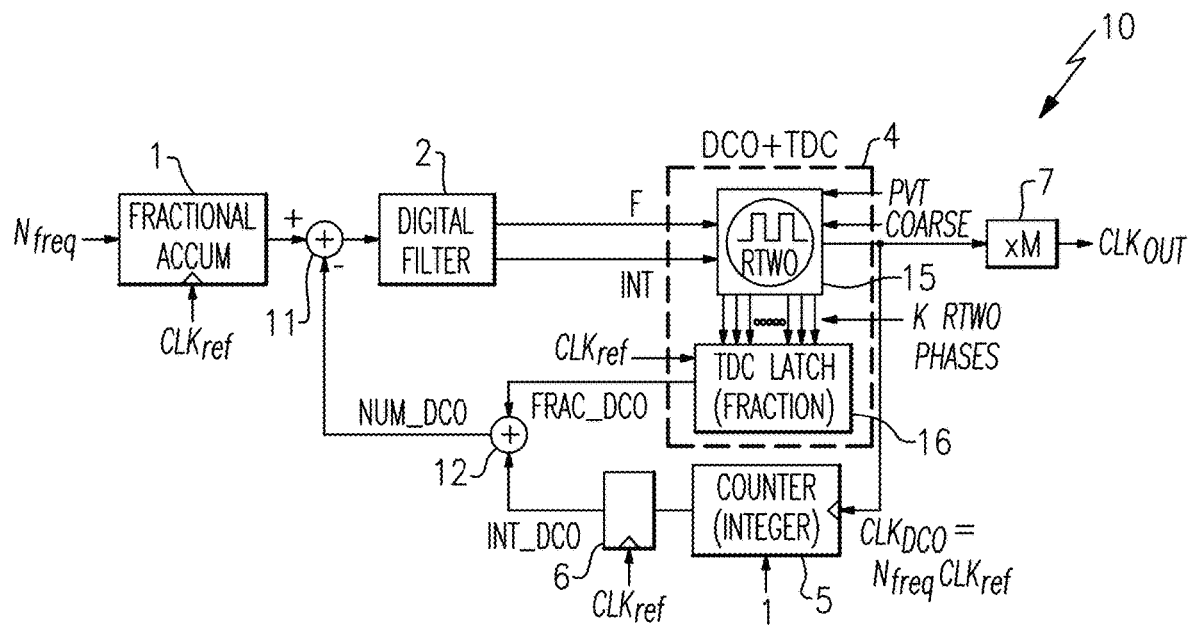
FIG. 1 is a schematic diagram of one implementation of an all-digital phase-locked loop (ADPLL).

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

As persons having ordinary skill in the art will appreciate, a rotary traveling wave oscillator (RTWO) can include a differential transmission line connected in a ring with an odd number of one or more crossovers, and a plurality of regeneration circuits electrically connected along a path of the differential transmission line. Additionally, each of the crossovers can reverse the polarity of a wave propagating along the differential transmission line, and the regeneration circuits can provide energy to the wave to compensate for the differential transmission line's losses. Additional details of RTWOs can be as described in U.S. Pat. No. 6,556,089, issued Apr. 29, 2003, and titled "ELECTRONIC CIRCUITRY," which is hereby incorporated by reference in its entirety herein.

Example of an all-Digital Phase-Locked Loop with a Rotary Traveling Wave Oscillator In certain configurations herein, an all-digital phase-locked loop (ADPLL) including a rotary traveling wave oscillator (RTWO) is provided. The ADPLL can be used in a variety of applications, including, but not limited to, radar (for instance, automotive radar), telecommunications, chip-to-chip communication, and/or automatic test equipment. In one example, the ADPLL generates an output clock signal having a wide variety of frequency ramp profiles and/or rates.

In contrast, an analog PLL with charge pumps can suffer from supply voltage variation, narrow tuning voltage range, and/or variation in loop dynamics. These drawbacks can be exacerbated in implementations using relatively small geometry processes, for instance, fine line CMOS processes. Although an ADPLL architecture can provide a number of advantages, the teachings herein are also applicable to RTWOs used in other electronic systems, such as analog PLLs using RTWOs.

In certain implementations, an ADPLL includes an RTWO that operates both as a digitally-controlled oscillator (DCO) and as a time-to-digital converter (TDC). Implementing the RTWO to provide a multitude of functions enhances a compactness of a design by using the RTWO for multiple purposes.

By using an RTWO in the ADPLL, a low figure of merit (FOM) can be achieved. The superior FOM is achieved in part by a fine resolution of the RTWO's TDC.

Although the RTWOs described herein can be used in ADPLLs, an RTWO implemented in accordance with the teachings herein can be used in a wide range of electronic systems and applications.

FIG. 1 is a schematic diagram of one implementation of an all-digital phase-locked loop (ADPLL) 10. The ADPLL 10 includes a fractional accumulator 1, a digital filter 2, a combined digitally controlled oscillator (DCO) and time-to-digital converter (TDC) 4, a counter 5, counter latches 6, a multiplier 7, a subtraction block 11, and an addition block 12. The combined DCO and TDC 4 includes an RTWO 15 and TDC latches 16.

As shown in FIG. 1, the ADPLL 10 includes the fractional accumulator 1, which accumulates a digital tuning word or code $N_{freq}$ at the rate of a reference clock signal $CLK_{REF}$. The digital tuning code $N_{freq}$ can be used to control an output frequency of the ADPLL 10. In the illustrated embodiment, for each cycle of the reference clock signal $CLK_{REF}$, the subtraction block 11 generates a difference signal based on a difference between an output of the fractional accumulator 1 and a number of DCO clocks NUM_DCO generated in part by the RTWO 15. The number of DCO clocks NUM_DCO corresponds to a digital code represented in integer and fractional form.

As shown in FIG. 1, the RTWO 15 and the TDC latches 16 operate to generate a fractional number of DCO clocks FRAC_DCO, which the addition block 12 combines with an integer number of DCO clocks INT_DCO to generate the number of DCO clocks NUM_DCO. In particular, the RTWO 15 generates K clock phases that are provided to the TDC latches 16. The TDC latches 16 process the K clock phases from the RTWO 15 based on timing of the reference clock signal $CLK_{REF}$ to determine the fractional number of DCO clocks FRAC_DCO. The K clock phases have the same oscillation frequency as one another, but different phases. In one embodiment, the RTWO outputs 64 or more phases to the TDC latches 16. However, other implementations are possible.

Although the TDC latches 16 are illustrated as a separate block from the RTWO 15, in certain implementations the TDC latches 16 are integrated into a layout of the RTWO 15, such as incorporated into the layout of the RTWO's segments.

With continuing reference to FIG. 1, the RTWO 15 outputs a DCO clock signal $CLK_{DCO}$, which can correspond to one of the K clock phases in certain implementations. In the illustrated embodiment, the DCO clock signal $CLK_{DCO}$ serves as an input to the multiplier 7, which multiplies the DCO clock signal $CLK_{DCO}$ by a multiplication factor M to generate an output clock signal $CLK_{OUT}$. Including the multiplier 7 enhances flexibility of the ADPLL 10 by expanding a range of frequencies that the output clock signal $CLK_{OUT}$ can be controlled. For instance, the multiplier 7 can be used to control the output clock signal $CLK_{OUT}$ to frequencies greater than a maximum oscillation frequency of the RTWO 15, and thus can serve as a frequency multiplier.

In one example, an RTWO is multiplied by a multiplication factor M. In another example, a multiplier is omitted.

As shown in FIG. 1, the DCO clock signal $CLK_{DCO}$ is provided to the integer counter 5, which operates in combination with the counter latches 6 to generate the integer number of DCO cycles INT_DCO. In the illustrated embodiment, the integer counter 5 counts a number of cycles of the DCO clock signal $CLK_{DCO}$. For example, the integer counter 5 can be loaded with an initial value of 1, and thereafter increment by 1 for each cycle of the DCO clock signal $CLK_{DCO}$.

The difference signal generated by the subtraction block 11 is filtered by the digital filter 2. Additionally, the filtered difference signal is used to tune RTWO 15 with both an integer digital tuning code INT and a fractional digital tuning code F, in this embodiment.

The RTWO 15 of FIG. 1 is tuned by the integer digital tuning code INT and the fractional digital tuning code F to change the RTWO's fundamental oscillation frequency. In certain implementations, the RTWO 15 can employ additional tuning, including, for example, coarse tuning and/or process, voltage, and temperature (PVT) tuning.

Accordingly, in certain implementations, the fractional digital tuning code F provides fine fractional tuning of the RTWO 15, and the integer digital tuning code INT provides fine integer tuning.

The RTWO 15 can be implemented to include one or more features disclosed herein.

The ADPLL 10 illustrates one example of an electronic system that can include an RTWO implemented in accordance with the teachings herein. However, the RTWOs described herein can be used in a wide variety of electronic systems, including, but not limited to, a wide variety of data converters and/or frequency synthesizers.

Examples of Rotary Traveling Wave Oscillators

Figure 2:
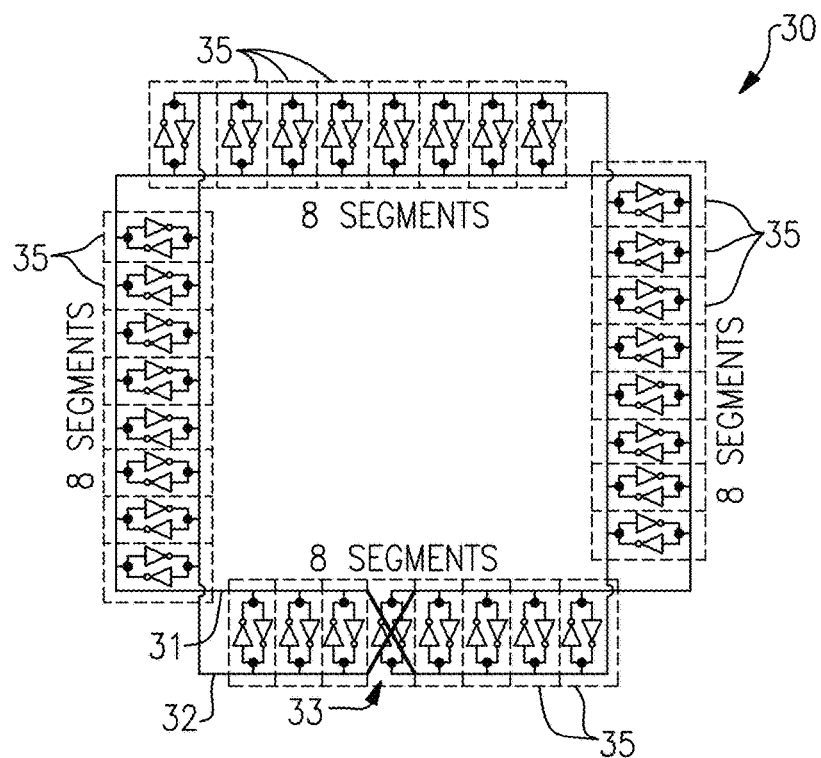
FIG. 2 is a schematic diagram of one implementation of a rotary traveling wave oscillator (RTWO).

FIG. 2 is a schematic diagram of one implementation of an RTWO 30. The RTWO 30 includes a differential transmission line including a first conductor 31 and a second conductor 32. As shown in FIG. 2, the differential transmission line 31, 32 is connected in a closed-loop or ring, and the differential transmission line includes a crossover 33 to provide inversion to a traveling wave propagating around the ring. The RTWO 30 of FIG. 3 further includes a plurality of segments 35 each including a regeneration circuit.

The illustrated RTWO 30 includes one crossover and thirty-two regeneration circuits, each implemented using back-to-back inverters, in this example. However, other configurations are possible, including, for example, configurations using a different number of crossovers, more or fewer segments, more or fewer regeneration circuits, and/or regeneration circuits implemented in other ways. Furthermore, the RTWO 30 can include other circuitry, including, but not limited to, tuning capacitors, latches, buffers, and/or other circuitry in the segments 35.

As shown in FIG. 2, the RTWO's differential transmission line is connected in a closed-loop and is folded at each of four corners. However, the RTWO's differential transmission line can be implemented in other ways, including, for example, different implementations of folding and/or routing of the conductors 31, 32. For instance, the teachings herein are applicable not only to RTWOs implemented using rectangular or square rings, but also to RTWOs including transmission lines shaped in other ways. Thus, although the illustrated RTWO includes four sides, the teachings herein are applicable to RTWOs including more or fewer sides as well as to RTWOs with curved rings.

In the illustrated embodiment, the RTWO 30 includes segments 35, which each include a regeneration circuit distributed at substantially regular intervals around the differential transmission line. Distributing the regeneration circuits uniformly aids in maintaining a uniform characteristic impedance of the differential transmission line and substantially constant wave velocity. Although each segment 35 includes one pair of back-to-back inverters, the teachings herein are applicable to segments including other numbers of regeneration circuits and/or different implementations of regeneration circuits.

In the illustrated embodiment, the RTWO 30 is segmented into 8 segments per side. Since each of the conductors 31, 32 provides a clock signal phase, the 32 illustrated segments 35 operate with 64 total clock signal phases. However, other implementations are possible.

The oscillation frequency $f_{OSC}$ of the RTWO 30 is based on a speed of a traveling wave propagating along the transmission line divided by a total length or distance the wave travels in a cycle. In certain implementations, the oscillation frequency $f_{OSC}$ of the RTWO 30 is given by Equation 1 below, where $v_p$ is the wave phase velocity, l is the length of the transmission line loop or ring, $L_{TL}$ is the transmission line inductance, and $C_{TL}$ in the transmission line capacitance.

$$f_{osc} = \frac{v_p}{2l} = \frac{1}{2\sqrt{L_{TL}C_{TL}}} \qquad \text{Equation 1}$$

In certain configurations herein, an RTWO's segments (for instance, the segments 35 of the RTWO 30) include one or more tuning capacitors having a capacitance that is digitally controllable to set an oscillation frequency of the RTWO.

It can be difficult to meet RTWO specifications with respect to tuning range and frequency tuning step size. Such challenges can be exacerbated in configurations in which the RTWO is specified to operate with a relatively high oscillation frequency. For example, an RTWO with relatively high oscillation frequency can have a relatively short transmission line loop, and thus can be constrained by available layout resources, such as available transistor active area and/or metal routing channels.

For example, the RTWO 30 can be included in the ADPLL 10 of FIG. 1. However, in certain applications, it can be desirable for the ADPLL 10 to operate at a relatively high oscillation frequency $f_{OSC}$ (for instance, 10 GHz or more), with a relatively wide tuning range (for instance 625 MHz or more), and with a relatively fine tuning resolution (for instance 200 kHz or less).

An RTWO's segments can include a wide variety of circuitry, including, for example, regeneration circuits (for instance, sustaining amplifiers), tuning capacitors, latches, buffers, and/or other circuitry. In a first example, to achieve sufficient tuning range, each RTWO segment can include multiple tuning capacitor banks, for instance, three or more tuning capacitor banks. In a second example, an RTWO's segments include TDC latches to provide time-to-digital conversion. In a third example, the RTWO's segments each include at least one tap buffer (for instance, a non-inverting or inverting buffer) used to obtain or extract a clock signal of a particular phase from the RTWO's ring.

Although it is desirable for an RTWO's segments to include a large number of circuits and/or circuits of relatively large size, the RTWO can be constrained by available layout resources, such as available active area and/or routing tracks. Moreover, providing additional layout resources by increasing the length of the RTWO's segments can undesirably increase the length of the RTWO's ring, which in turn lowers the RTWO's oscillation frequency.

In certain configurations herein, an RTWO includes segments having metal stubs extending from the RTWO's differential transmission line. The metal stubs provide connectivity to additional layout resources. For example, the segment layouts can be relatively wide (for example, in a first dimension substantially perpendicular to a local portion of the RTWO's transmission line) and can include tuning capacitors and other circuitry that are connected to the metal stubs. However, the segment layouts have a relatively short length (for example, in a second dimension substantially parallel to a local portion of the RTWO's transmission line) such that the RTWO's transmission line loop is relative short to provide high oscillation frequency, for instance, 10 GHz or more.

Accordingly, the metal stubs extend from the RTWO's differential transmission line to provide connection to tuning capacitors and/or other circuitry that facilitate implementation of wide tuning range, fine frequency step size, high oscillation frequency, and/or provide the RTWO with additionally functionality, such as time-to-digital conversion functionality and/or segment programmability.

Figure 3A:
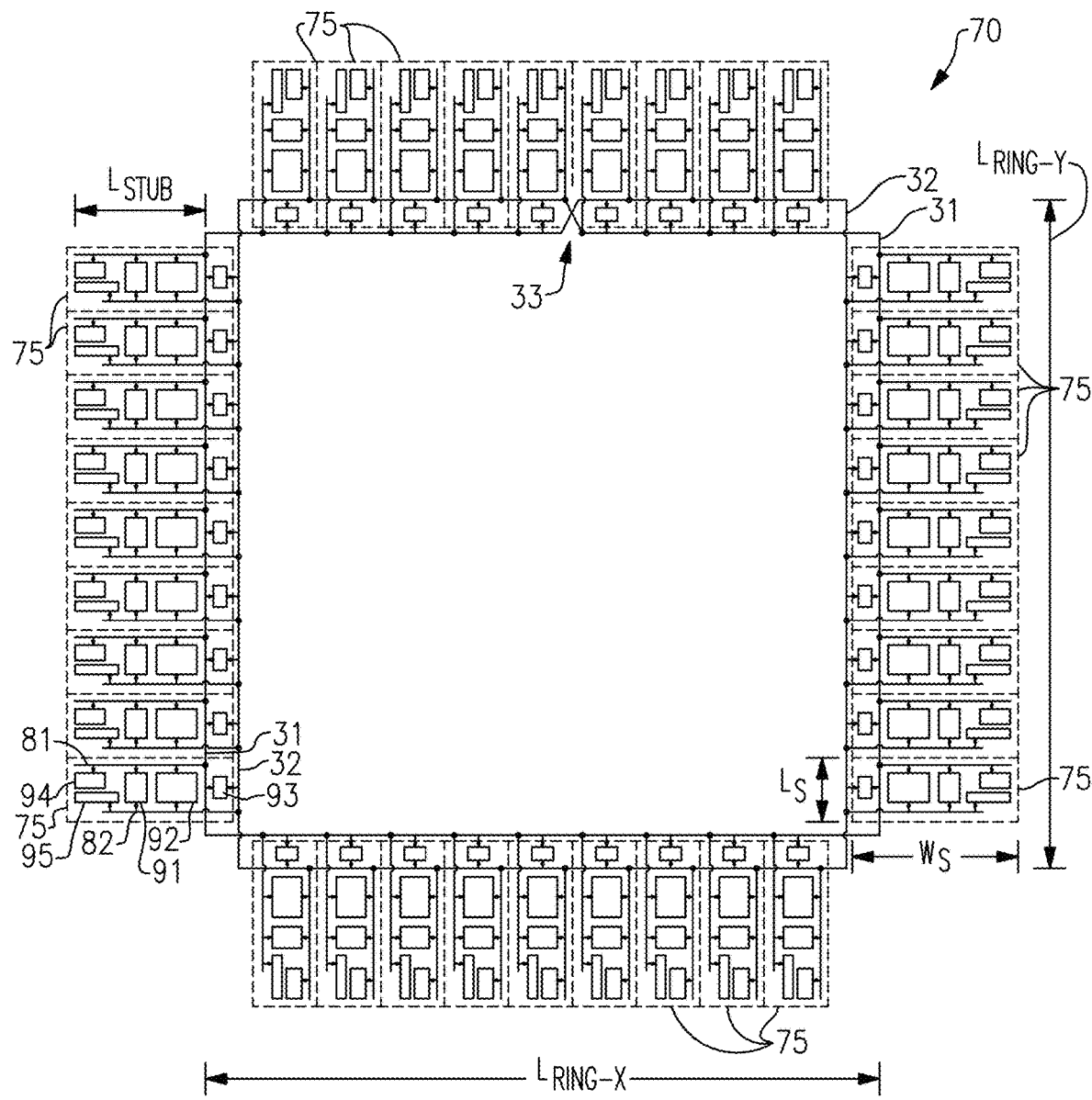
FIG. 3A is a schematic diagram of another implementation of an RTWO.

FIG. 3A is a schematic diagram of another implementation of an RTWO 70. The RTWO 70 includes a differential transmission line including a first conductor 31, a second conductor 32, and a crossover 33. The RTWO 70 further includes and plurality of segments 75.

In the illustrated embodiment, the RTWO 70 includes one crossover and thirty-two segments. However, other configurations are possible, including, for example, configurations using a different number of crossovers and/or more or fewer segments. Additionally, in the illustrated embodiment, the RTWO's differential transmission line is connected in a closed-loop and is folded at each of four corners. However, the RTWO's differential transmission line can be implemented in other ways, including, for example, different implementations of folding and/or routing of the conductors 31, 32. For instance, the teachings herein are applicable not only to RTWOs implemented using rectangular or square loops, but also to RTWOs including transmission lines shaped in other ways. Thus, although the illustrated RTWO 70 includes four sides, the teachings herein are applicable to RTWOs including more or fewer sides.

In the illustrated embodiment, the RTWO 70 includes segments 75, which each include a first metal stub 81 and a second metal stub 82, which extend from the first conductor 31 and the second conductor 32, respectively. The first and second metal stubs 81, 82 are used to provide local clock phase signals from the RTWO's differential transmission line to the circuitry of the segments 75.

In the illustrated embodiment, each segment 75 includes a TDC latch 91, tuning capacitors 92, and a regeneration circuit 93 that operate using both a clock signal phase from the first conductor 31 and a clock signal phase from the second conductor 32. However, other implementations are possible. Although illustrated as being connected between the first and second conductors 31, 32 of the RTWO ring, in another example the regeneration circuit 93 is connected between the first and second metal stubs 81, 82. In the illustrated embodiment, each segment 75 includes a first tap buffer 94 that taps the first conductor 31 to obtain a first clock signal phase, and a second tap buffer 95 that taps the second conductor 32 to obtain a second clock signal phase.

Although one specific implementation of segment circuitry is shown in FIG. 3A, other implementations of segment circuitry are possible, including configurations including more or fewer circuits and/or different circuits. For example, in another embodiment, a first set and a second set of tuning capacitors are connected to the first and second conductors 31, 32, respectively. In yet another embodiment, the segments include circuitry that provides segment programmability.

By including the first and second metal stubs 81, 82 extending from the RTWO's differential transmission line 31, 32, the RTWO's segments 75 can be implemented with a wide layout that provides active area and routing resources suitable for segment circuitry. Additionally, the RTWO includes a differential transmission line 31, 32 in a relatively short loop, and thus the RTWO 70 has a relatively high oscillation frequency.

In one embodiment, an RTWO has a total loop length less than 7,500 µm, and the stub length of each of the first and second metal stubs 81, 82 is at least 25 µm. For instance, with respect to the rectangular loop shown in FIG. 3A, in one embodiment, the RTWO of FIG. 3A has a first length $L_{RING-X}$ less than about 1,875 µm and a second length $L_{RING-Y}$ less than about 1,875 µm.

The stub length can be expressed in terms of a fraction of a wavelength of the RTWO's traveling wave. In one embodiment, the first and second metal stubs 81, 82 each are at least about 0.05λ in length, where λ is the RTWO's wavelength. As skilled artisans will appreciate, the wavelength of an RTWO can expresses as a ratio of the RTWO's wave phase velocity to the RTWO's oscillation frequency, or $v_p/f_{osc}$.

In one embodiment, the segments 75 have a length of less than about 25 µm, and a width of at least about 25 µm.

In one embodiment, an RTWO includes at least 1 segment per 25 µm of loop.

Figure 3B:
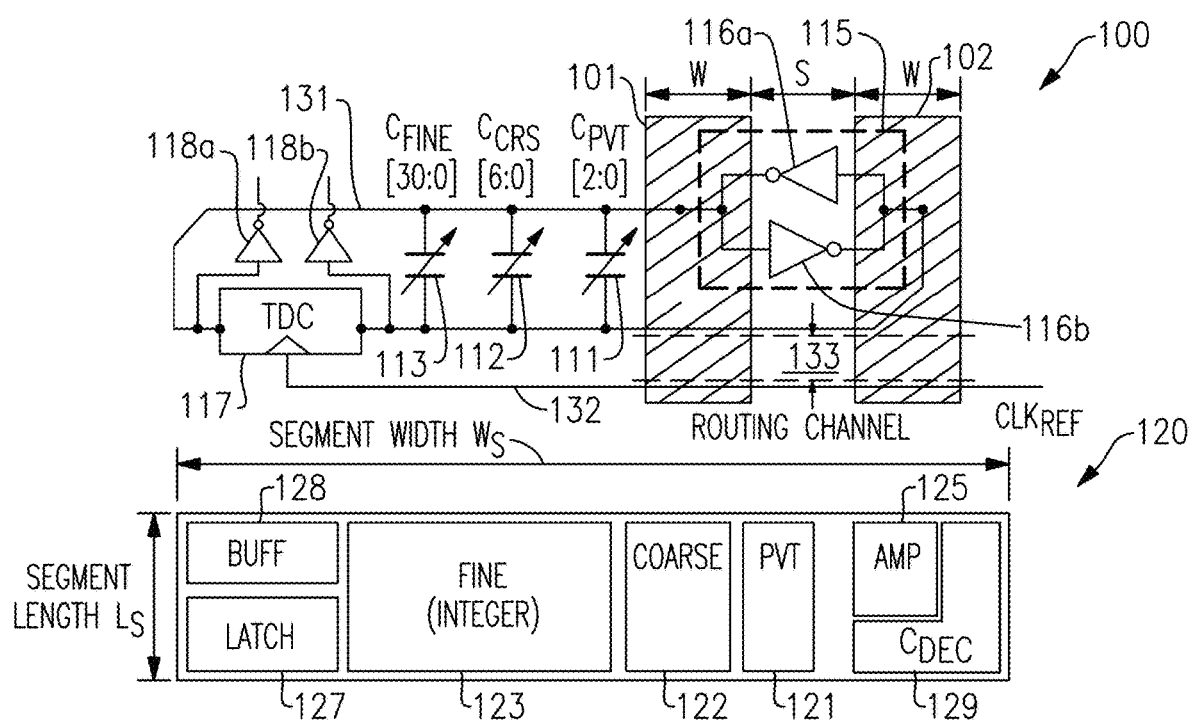
FIG. 3B is a schematic diagram of one implementation of an RTWO segment.

FIG. 3B is a schematic diagram of one implementation of an RTWO segment 100. The RTWO segment 100 is connected to a first transmission line conductor 101 and a second transmission line conductor 102 of a ring of an RTWO.

For clarity of the figures, only a portion of the first transmission line conductor 101 and the second transmission line conductor 102 are shown in FIG. 3B. However, the first transmission line conductor 101 and the second transmission line conductor 102 operate as a section of an RTWO's differential transmission line that is connected in a ring.

The RTWO segment 100 of FIG. 7 includes a PVT tuning capacitor bank 111, a coarse tuning capacitor bank 112, a fine tuning capacitor bank 113, a regeneration circuit 115, a TDC latch 117, a first tap buffer 118a, a second tap buffer 118b, a first metal stub 131, and a second metal stub 132.

The PVT tuning capacitor bank 111 includes selectable capacitors used to compensate for process, temperature, and/or voltage variations. Additionally, the coarse tuning capacitor bank 112 includes selectable capacitors used to provide coarse tuning of the oscillation frequency of the RTWO. Furthermore, the fine tuning capacitor bank 113 includes selectable capacitors used to provide fine tuning of the oscillation frequency of the RTWO. The tuning capacitors banks can be implemented using any suitable tunable capacitor structure, including, but not limited to, banks of parallel capacitor elements digitally selectable via switches.

Although an example of an RTWO segment including three tuning capacitor banks is illustrated in FIG. 3B, the teachings herein are applicable to RTWOs tuned using more or fewer capacitor banks.

In the illustrated embodiment, the PVT tuning capacitor bank 111 operates using a PVT tuning code of three bits, the coarse tuning capacitor bank 112 operates using a coarse tuning code of seven bits, and the fine tuning capacitor bank 113 operates using a fine integer tuning code of thirty-one bits. Although one specific example of bit widths is shown, the teachings herein are applicable to tuning with a wide variety of bit widths. Accordingly, other implementations are possible. In certain implementations, the fine tuning capacitor bank 113 is controlled via a PLL feedback loop. For example, the fine integer tuning code can be controlled by a digital filter of a PLL.

The illustrated RTWO segment 100 further includes the TDC latch 117, which is used to detect passage of a traveling wave traveling along first and second transmission line conductors 101, 102. For example, the outputs of the TDC latches around the RTWO's ring can be processed to generate a digital representation of time instances at which the traveling wave passes different positions around the loop. The output of the TDC latches can be used, for example, to determine a fractional number of clock cycles that have elapsed.

As shown in FIG. 3B, the TDC latch 117 receives a reference clock signal $CLK_{REF}$. In certain implementations, the reference clock signal $CLK_{REF}$ is provided to the RTWO segment 100 via a clock distribution tree.

In the illustrated embodiment, the first tap buffer 118a and the second tap buffer 118b are implemented using inverters. The first tap buffer 118a and the second tap buffer 118b are used to generate clock signal phases that are about 180° separated from one another. By providing tap buffers along different positions along the RTWO's ring, a set of clock signals of desired phases can be obtained. Although FIG. 7 illustrates a configuration in which inverters are used to provide tapping, an RTWO can include tap buffer circuitry implemented in a wide variety of ways.

In the illustrated embodiment, the regeneration circuit 115 includes a first inverter 116a and a second inverter 116b. Additionally, an input of the first inverter 116a is electrically connected to an output of the second inverter 116b, and an output of the first inverter 116a is electrically connected to an input of the second inverter 116b. However, an RTWO segment can include regeneration circuits implemented in other ways.

The first and second metal stubs 131, 132 provide local clock phases from the RTWO's loop to circuitry of the RTWO segment 100. By using the first and second metal stubs 131, 132, the length of the RTWO segment 100 can be relatively short, which in turn results in a relatively short RTWO ring and a corresponding high RTWO oscillation frequency.

In certain configurations herein, an RTWO segment includes a routing channel 133 used to provide passage of routing tracks through the RTWO segment.

As shown in FIG. 3B, the first and second metal stubs 131, 132 provide connections from the first transmission line conductor 101 and the second transmission line conductor 102, respectively, to circuitry of the RTWO segment 100. For example, the first and second metal stubs 131, 132 connect the RTWO's ring to tuning capacitors and other circuitry of the RTWO segment 100.

The first and second metal stubs 131, 132 provide a capacitive load that operates as part of the transmission line's characteristic impedance $Z_o$. In certain implementations, the metal stubs can be implemented with about equal length and can be distributing in substantially even intervals around the RTWO's ring. Although the stubs are illustrated as being substantially identical for each segment, in other configurations the stubs can be implemented differently for one or more of the segments. In one example, design rules of process constrains the layout of transistors to be in one direction, and the stubs along the top and bottom sides of an RTWO are implemented differently than stubs on the left and right sides of the RTWO.

As shown in FIG. 3B, the first metal stub 131 is connected to the first transmission line conductor 101 (for instance, by way of a via), and extends from the first transmission line conductor 131 to provide connections to circuitry of the RTWO segment 100. In the illustrated embodiment, the first metal stub 131 connects to a first terminal of the PVT tuning capacitor bank 111, to a first terminal of the coarse tuning capacitor bank 112, to a first terminal of the fine tuning capacitor bank 113, to an input of the first tap buffer 118a, and to a first input of the TDC latch 117. In the illustrated embodiment, an end portion of the first metal stub 131 bends before connecting to the first input of the TDC latch 117. However, other implementations are possible.

With continuing reference to FIG. 3B, the second metal stub 132 is connected to the second transmission line conductor 102 (for instance, by way of a via). After an initial turn or bend, the second metal stub 132 extends from the second transmission line conductor 132 to provide connections to circuitry of the RTWO segment 100. In the illustrated embodiment, the second metal stub 132 connects to a second terminal of the PVT tuning capacitor bank 111, to a second terminal of the coarse tuning capacitor bank 112, to a second terminal of the fine tuning capacitor bank 113, to an input of the second tap buffer 118b, and to a second input of the TDC latch 117. However, other implementations are possible.

In one embodiment, the first metal stub 101 and the second metal stub 102 each have a length (including bends) at least about 25 μm. In one example, the stubs 101, 102 are about 95 μm in length, corresponding to about 6% of a wavelength (or 0.06λ) of an RTWO operating at 10 GHz.

As shown in FIG. 3B, the transmission line conductors 101, 102 of the RTWO's ring have a width W, and are spaced apart from one another by a spacing S. The width W and spacing S can be any suitable value, for instance, W=12 um and S=8 um.

In certain implementations, the transmission line conductors 101, 102 are positioned on different metal layers relative to the metal stubs 131, 132. In one example, the transmission line conductors 101, 102 of the RTWO's differential transmission line are implemented on two or more adjacent upper metal layers (for instance, a stack of metal-8 and metal-9), and the stubs are implemented on a lower metal layer (for instance, metal-7). As persons having ordinary skill in the art will appreciate, a lower metal layer is closer to a semiconductor substrate relative to an upper metal layer.

As shown in FIG. 3B, a floor plan layout 120 of the RTWO segment 100 has been illustrated. The floor plan layout 120 includes a PVT tuning capacitor bank layout 121, a coarse tuning capacitor bank layout 122, a fine tuning capacitor bank layout 123, a regeneration amplifier layout 125, a TDC latch layout 127, a tap buffer layout 128, and a decoupling capacitor layout 129.

The PVT tuning capacitor bank layout 121 corresponds to a boundary of active area (for instance, transistor layouts and/or capacitor sizes) of the PVT tuning capacitor bank 111, the coarse tuning capacitor bank layout 122 corresponds to a boundary of active area of the coarse tuning capacitor bank 112, and the fine tuning capacitor bank layout 123 corresponds to a boundary of active area of the fine tuning capacitor bank 113. Furthermore, the tap buffer layout 128 corresponds to a boundary of active area of the tap buffers 118a, 118b, and the TDC latch layout 127 corresponds to a boundary of active area of the TDC latch 117. Additionally, the regeneration amplifier layout 125 corresponds to a boundary of active area for the inverters 116a, 116b, and the decoupling capacitor layout 129 corresponds to a boundary of active area of a decoupling capacitor between power and ground for the regeneration circuit 115.

In one embodiment, the RTWO segment 100 has a length $S_L$ of less than about 25 μm, and a width $S_W$ of at least about 25 μm. In certain implementations, the RTWO segment 100 has a width greater than the length such that numerous segments can be distributed around the RTWO's ring while maintaining a relatively short RTWO conductor loop length and corresponding high oscillation frequency.

In one embodiment, an RTWO includes at least 1 segment per 25 μm of loop.

Although a specific implementation of RTWO segment circuitry and floor plan layout has been described above, the teachings herein are applicable to a wide variety of implementations of RTWO segments.

Examples of Segmented Decoding for a Rotary Traveling Wave Oscillator

In certain configurations herein, a segmented decoding scheme is provided for RTWO frequency tuning codes to reduce decoding complexity. The segmented decoding scheme can operate using a combination of global decoding and local decoding to process the frequency tuning codes. By using segmented decoding, a number of signal routes associated with frequency tuning codes can be reduced.

An RTWO can operate with a large number of tuning capacitors, including tuning capacitors for PVT tuning, coarse tuning, and fine tuning (including, for instance, both fine integer and fine fractional tuning). The number of tuning capacitors can be further increased in implementations using multiple rings coupled to one another to reduce phase noise. The large number of tuning capacitors can lead to a large number of signal routes or wires.

In one example, a 4-ring RTWO includes 32 segments per ring, with each segment including a PVT tuning capacitor bank with 2 bits, a coarse tuning capacitor bank with 3 bits, and a fine integer tuning capacitor bank with 5 bits. Additionally, each ring includes one instantiation of a fine fractional tuning capacitor bank with 5 bits. In this example, without segmented decoding the PVT tuning capacitor banks operate with 256 wires (2 bits*32 segments*4 rings), the coarse tuning capacitor banks operate with 384 wires (3 bits*32 segments*4 rings), the fine integer tuning capacitor banks operate with 640 wires (5 bits*32 segments*4 rings), and the fine fractional tuning capacitor banks operate with 20 wires (5 bits*4 rings). Thus, a total number of wires in this example can be 256+384+640+20=1300 wires.

However, routing a voluminous amount of wires leads to routing congestion. Moreover, the routes can lead to an electrical environment subject to potential coupling of digital spurious components to the RTWO. For instance, a large collection of wires can act as a large antenna on a semiconductor chip. Additionally, the flexibility and/or scalability of the RTWO design can be constrained. For instance, such routing congestion can limit a maximum number of RTWO rings that can be coupled to one another to improve phase noise.

In certain configurations herein, tuning capacitors across RTWO segments are quantized, such that the tuning capacitors of each RTWO segment can be controlled separately from tuning capacitors of other segments. Additionally, a global decoder processes frequency tuning codes (for instance, a PVT tuning code, a coarse tuning code, and/or a fine integer tuning code) to generate input codes for local decoders of the RTWO. In certain implementations, thermometer decoding is performed locally for each segment via the local decoders. In multi-ring implementations, the frequency tuning codes can routed to global decoders associated with each of the RTWO's rings.

By using a segmented decoding scheme, a number of metal routes or wires can be reduced.

For instance, in the specific example described above, 1300 wires were used for a 4-ring RTWO that operated without segmented decoding. In contrast, segmented decoding in this specific example can be used to provide PVT tuning with 7 bits (for instance, 3 thermometer bits per segment*32 segments=96 LSB<$2^7$), coarse tuning with 8 bits (for instance, 7 thermometer bits per segment*32 segments=224 LSB<$2^8$), and fine integer tuning with 12 bits (for instance, 31 thermometer bits per segment*32 segments*4 rings=3968 LSB<$2^{12}$). Thus, the PVT tuning operates with 28 wires (7 bits*4 rings), coarse tuning operates with 32 wires (8 bits*4 rings), and fine integer tuning operates with 48 wires (12 bits*4 rings). Thus, a total number of wires in this example can be 28+32+48+20=128 wires, which is about an order of magnitude less than the implementation without segmented decoding.

Figure 4:
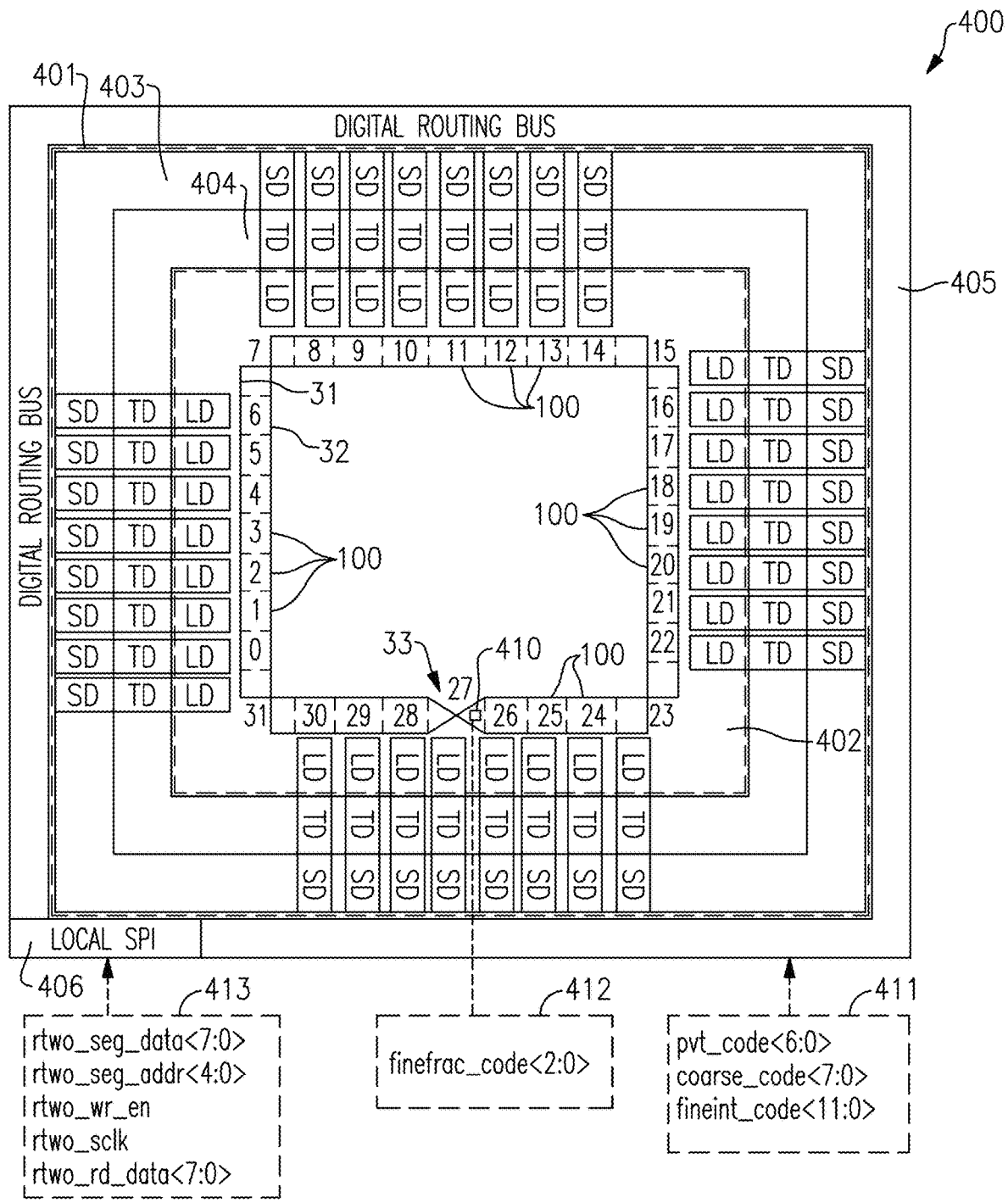
FIG. 4 illustrates one implementation of an RTWO with segmented decoding.

FIG. 4 illustrates one embodiment of an RTWO 400 with segmented decoding. In certain configurations herein, segmented decoding is provided to reduce a number of wires to route to an RTWO, such as a number of digital signal routes from an ADPLL core to an RTWO.

Figure 10:
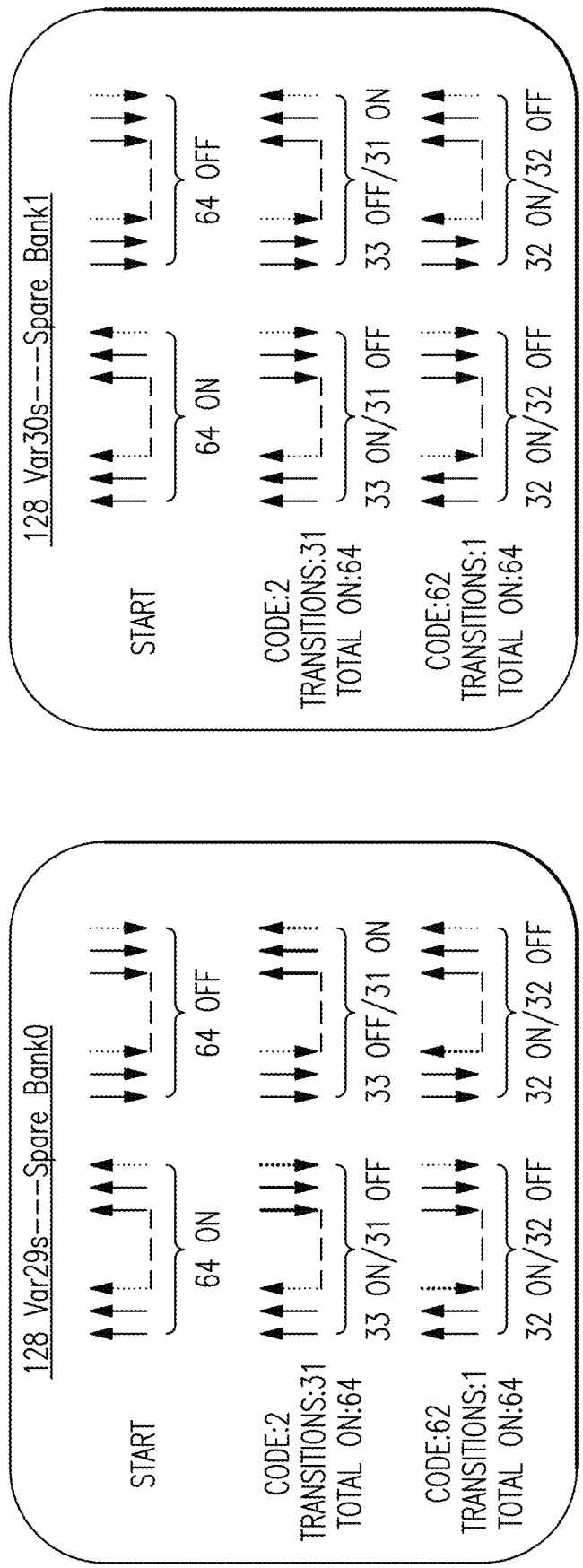
FIG. 10 is a one example of an operational diagram for spare banks for transition controlled DEM.

The RTWO 400 includes a differential transmission line connected in a closed-loop or ring. The differential transmission line includes a first conductor 31, a second conductor 32, and a crossover 33. The RTWO 400 further includes segments 100, which can be as described earlier with respect to FIG. 3B. In the illustrated embodiment, thirty-two instantiations of the segment 100 are positioned around the ring, with eight segments per side of the ring. As shown in FIG. 10, the thirty-two segments are labeled with indexes ranging between 0 and 31.

The RTWO 400 further includes a global decoder system 401, a local decoder system 402, a digital routing bus 405, a serial interface 406, and a fine fractional tuning capacitor bank 410.

Although one specific RTWO implementation is shown, the teachings herein are applicable to RTWOs implemented in a wide variety of ways, including, but not limited to, RTWOs with different ring implementations, different segment implementations, and/or different decoder implementations.

The global decoder system 401 includes a segment decoder system 403 and a tuning decoder system 404. The global decoder system 401 can be implemented using digital logic circuitry, such as digital logic generated via digital synthesis. For instance, the segment decoder system 403 and/or the tuning decoder system 404 can be described using a hardware description language, such as Verilog, which can be synthesized to generate digital logic circuitry. However, other implementations are possible. Although shown as distributed per segment, one or more decoders can be configured to provide decoding to multiple segments. For instance, one decoder can be used per RTWO side.

The tuning decoder system 404 serves to decode frequency tuning codes (for instance, PVT, coarse, and/or fine integer tuning codes) to generate input codes to the local decoder system 402. The input codes are processed by the local decoder system 402 to activate appropriate tuning capacitors of the RTWO segments.

In the illustrated embodiment, the tuning decoder system 404 includes a tuning decoder (TD) for each segment 100. Additionally, the local decoder system 402 includes a local decoder (LD) for each segment 100. In certain implementations, a LD is used to convert a binary input code from a corresponding TD to a thermometer encoded output code used to select a number of active tuning capacitors of a particular RTWO segment 100.

As shown in FIG. 4, the digital routing bus 405 surrounds a perimeter of the RTWO 400. The digital routing bus 405 can be used to route a wide variety of input signals to the global decoder system 401.

For example, the global decoder system 401 of the RTWO 400 has been annotated to illustrate inputs signals 411-412 used for frequency tuning, including a PVT tuning code (pvt_code<6:0>), a coarse tuning code (coarse_code<7:0>), a fine integer tuning code (fineint_code<7:0>), and a fine fractional tuning code (finefrac_code<2:0>). Although not illustrated in FIG. 10 for clarity, the RTWO 400 can receive one or more clock signals used to indicate timing of the tuning codes.

In the illustrated embodiment, the digital routing bus 405 provides the PVT tuning code, the coarse tuning code, and the fine integer tuning code to the tuning decoder system 404, which processes the codes to generate input codes to control the local decoder system 402. The local decoder system 402 processes the inputs codes to control PVT tuning banks, coarse tuning banks, and fine integer tuning banks of the RTWO segments 100.

As shown in FIG. 4, one instantiation of the fine fractional tuning bank 410 is included in the illustrated RTWO 400, and the fine fractional tuning code (finefrac_code<2:0>) is provided to the fine fractional tuning bank 410 to control fine fractional tuning. Thus, the fine fractional tuning code bypasses the tuning decoder system 404, in this example. In certain implementations, an LD is included to decode the fine fractional tuning code to generate thermometer bits to control the fine fractional tuning bank 410.

Although one specific implementation of frequency tuning codes and decoding is shown, the teachings herein are applicable to a wide variety of implementations.

The segment decoder system 403 includes a segment decoder (SD) for each segment 100. The segment decoder system 403 serves to decode data received via the serial interface 406 to the RTWO's segments 100.

As shown in FIG. 4, the serial interface 406 receives input signals 413 including a segment data signal (rtwo_seg_data<7:0>), a segment address signal (rtwo_seg_addr<4:0>), a write enable signal (rtwo_wr_en), a serial interface clock signal (rtwo_sclk), and a read data signal (rtwo_rd_data<7:0>). In certain implementations, the serial interface 406 is implemented as a local serial peripheral interface (SPI).

In the illustrated embodiment, the digital routing bus 405 routes the input signals 413 to each SD of the segment decoding system 403 for decoding.

It can be desirable for the segments of an RTWO, such as the RTWO segments 100, to be configurable. To provide configurability, the RTWO segments 100 can be written or read to via the serial interface 406.

The illustrated RTWO 400 includes the segment decoder system 401, which reduces a number of routes associated with communicating with the RTWO segments 100. In certain implementations, the segment decoder system 403 operates using a local register map. The local register map is used to provide bit addresses for each of the segments, and is used to determine when the serial interface 406 is communicating with a particular one of the RTWO segments 100.

By including the segment decoder system 401, a number of data and address bus bits associated with routing from the serial interface 406 to the RTWO segments 100 can be reduced.

For example, in one specific implementation, a 4-ring RTWO with 32 segments per ring includes a data bus that operates using 8 bits common to 4 rings, and an address bus that operates using 5 bits common to 4 rings. In such an example, the 4-ring RTWO operates with 13 bits and wires.

In contrast, a similar 4-ring RTWO implemented with a segment decoder system can include 2048 bits and wires (16 bits per segment*32 segments*4 rings). Thus, a reduction of over one hundred-fold can be achieved by including a segment decoder system in this specific example.

Figure 5:
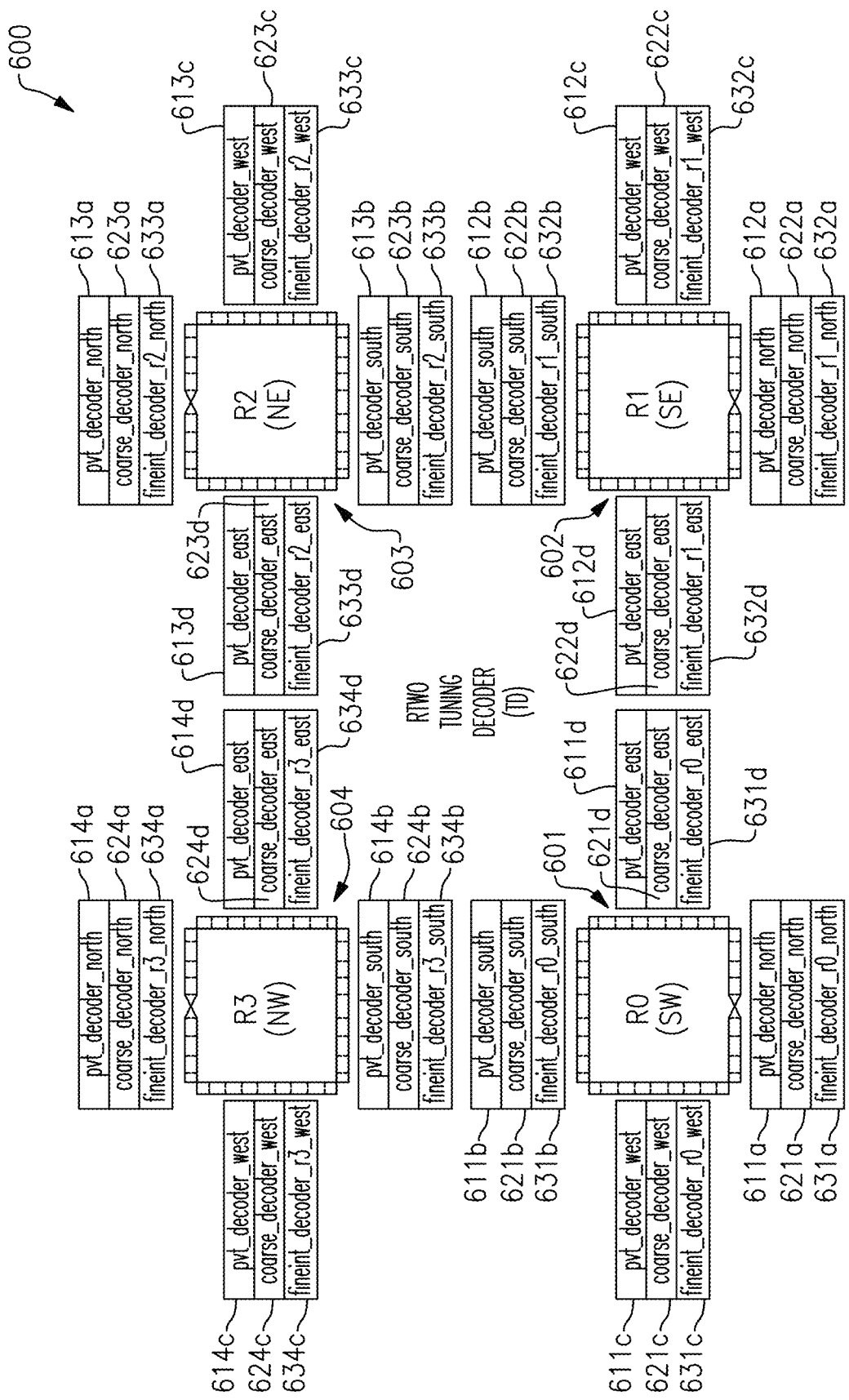
FIG. 5 illustrates one implementation of tuning decoders for a multi-ring RTWO.

FIG. 5 illustrates one implementation of tuning decoders for a multi-ring RTWO 600. The multi-ring RTWO 600 includes a southwest RTWO ring 601 (R0), a southeast RTWO ring 602 (R1), a northeast RTWO ring 603 (R2), and a northwest RTWO ring 604 (R3). Although a configuration using four rectangular RTWO rings is shown, the teachings herein are applicable to implementations using more or fewer rings and/or rings implemented with other shapes.

Although terms related to cardinal directions (north, south, east, west, northeast, northwest, southeast, southwest) are used in describing the multi-ring RTWO, persons having ordinary skill in the art will appreciate that the terms are used herein for understanding relative orientations, and do not refer to true directions. For example, the multi-ring RTWO 600 is typically implemented at least in part on an integrated circuit (IC) or semiconductor die, and the orientation of the multi-ring RTWO 600 changes as the IC changes position or angle. Similarly, terms related to top, bottom, left, and right are used to describe relative directions.

As shown in FIG. 5, PVT tuning decoders, coarse tuning decoders, and fine integer tuning decoders are provided around the sides of each of the RTWO rings 601-604.

With respect to the northwest RTWO ring 604, a north PVT decoder 614a, a north coarse decoder 624a, and a north fine integer decoder 634a are positioned on a first or top side. Additionally, a south PVT decoder 614b, a south coarse decoder 624b, and a south fine integer decoder 634b are positioned on a second or bottom side. Furthermore, a west PVT decoder 614c, a west coarse decoder 624c, and a west fine integer decoder 634c are positioned on a third or left side. Additionally, an east PVT decoder 614d, an east coarse decoder 624d, and an east fine integer decoder 634d are positioned on a fourth or right side.

Additionally, orientations of corresponding tuning decoders of the northeast RTWO ring 603 are line symmetric with respect to the northwest RTWO ring 604. For example, with respect to the northeast RTWO ring 603, a north PVT decoder 613a, a north coarse decoder 623a, and a north fine integer decoder 633a are positioned on a top side. Additionally, a south PVT decoder 613b, a south coarse decoder 623b, and a south fine integer decoder 633b are positioned on a bottom side. Furthermore, a west PVT decoder 613c, a west coarse decoder 623c, and a west fine integer decoder 633c are positioned on a right side. Additionally, an east PVT decoder 613d, an east coarse decoder 623d, and an east fine integer decoder 633d are positioned on a left side.

Furthermore, orientations of corresponding tuning decoders of the southwest RTWO ring 601 are line symmetric with respect to the northwest RTWO ring 604. For example, with respect to the southwest RTWO ring 601, a north PVT decoder 611a, a north coarse decoder 621a, and a north fine integer decoder 631a are positioned on a bottom side. Additionally, a south PVT decoder 611b, a south coarse decoder 621b, and a south fine integer decoder 631b are positioned on a top side. Furthermore, a west PVT decoder 611c, a west coarse decoder 621c, and a west fine integer decoder 631c are positioned on a left side. Additionally, an east PVT decoder 611d, an east coarse decoder 621d, and an east fine integer decoder 631d are positioned on a right side.

Additionally, orientations of corresponding tuning decoders of the southeast RTWO ring 602 are line symmetric with respect to both the southwest RTWO ring 601 and the northeast RTWO ring 603. For example, with respect to the southeast RTWO ring 602, a north PVT decoder 612a, a north coarse decoder 622a, and a north fine integer decoder 632a are positioned on a bottom side. Additionally, a south PVT decoder 612b, a south coarse decoder 622b, and a south fine integer decoder 632b are positioned on a top side. Furthermore, a west PVT decoder 612c, a west coarse decoder 622c, and a west fine integer decoder 632c are positioned on a right side. Additionally, an east PVT decoder 612d, an east coarse decoder 622d, and an east fine integer decoder 632d are positioned on a left side.

Implementing tuning decoders of one RTWO ring with line symmetry with respect to the tuning decoders of another RTWO ring provides symmetry that reduces mismatch between the rings.

In the illustrated embodiment, tuning decoders are placed at each side of the RTWO ring. Additionally, the tuning decoders control tuning capacitors of adjacent RTWO segments, which reduces connections between the tuning decoders' outputs and RTWO segments. For example, in an implementation with 32 segments per RTWO ring, the north tuning decoders provide decoding to 8 corresponding segments of the RTWO ring. Accordingly, route lengths are reduced. Thus, the illustrated tuning decoders can illustrate a collection of TD blocks as depicted in FIG. 4. However, other implementations are possible. For example, a separate TD block can be provided for each RTWO segment.

As shown in FIG. 5, the PVT tuning decoders of the RTWO rings 601-604 are denoted with text labels pvt_decoder_north, pvt_decoder_west, pvt_decoder_south, and pvt_decoder_east. Additionally, the coarse tuning decoders are denoted with text labels coarse_decoder_north, coarse_decoder_west, coarse_decoder_south, and coarse_decoder_east. In certain implementations, the PVT tuning decoders are substantially identical for each of the RTWO rings and segments, and the PVT tuning decoders operate with common PVT tuning codes. Additionally, in certain implementations the coarse tuning decoders are substantially identical for each of the RTWO rings and segments, and the coarse tuning decoders operate with common coarse tuning codes.

As shown in FIG. 5, the fine integer tuning decoders of the RTWO rings 601-604 are denoted with text labels fineint_decoder_r0_north, fineint_decoder_r0_west, fineint_decoder_r0_south, fineint_decoder_r0_east, fineint_decoder_r1_north, fineint_decoder_r1_west, fineint_decoder_r1 south, fineint_decoder_r1 east, fineint_decoder_r2 north, fineint_decoder_r2 west, fineint_decoder_r2 south, fineint_decoder_r2 east, fineint_decoder_r3 north, fineint_decoder_r3 west, fineint_decoder_r3 south, and fineint_decoder_r3 east.

In certain implementations, the fine integer tuning decoders are implemented using substantially identical hardware (for instance, substantially identical Verilog), but operate with different values of rtwo_location<3:0>, and thus have different output values. Implementing the decoders in this manner enhances scalability and flexibility.

Although FIG. 5 illustrates one embodiment of tuning decoders for a multi-ring RTWO, tuning decoders can be implemented in a wide variety of ways.

Examples of Dynamic Element Matching to Linearize Fine-Tuning Gain of an RTWO

In certain configurations herein, a dynamic element matching (DEM) scheme is provided to linearize the fine-tuning gain characteristics of an RTWO. For example, dynamic element matching can be used to break a periodicity of a fixed sequence of segment selection used in the segmented decoding scheme for the RTWO. Reducing or eliminating periodicity in segment sequence selection achieves mitigation of undesirable spurious frequency components. In contrast, a fixed sequence of selecting RTWO segments can degrade spectral integrity by generating spurious frequency components.

For example, a wide frequency ramp can straddle a full range of fine tuning codes. When a fixed sequence of segment selection is used, a spurious component appears at a frequency offset from the fundamental frequency. The frequency of the spurious component is based on the period of the fixed sequence of segment selection.

Table 1 below illustrates one example of a fixed sequence selection for one implementation of the multi-ring RTWO 600 of FIG. 5. In Table 1, W0, W1, W2, and W3 indicate the west tuning decoders of RTWO rings R0, R1, R2, and R3 respectively. Similarly, S0, S1, S2, and S3 indicate the south tuning decoders of RTWO rings R0, R1, R2, and R3 respectively. Likewise, E0, E1, E2, and E3 indicate the east tuning decoders of RTWO rings R0, R1, R2, and R3 respectively. Additionally, N0, N1, N2, and N3 indicate the north tuning decoders of RTWO rings R0, R1, R2, and R3 respectively.

TABLE 1

| fineint code | Decoder Outputs | | | | | | | | | | | | | | | |
| --- | --- | --- | --- | --- | --- | --- | --- | --- | --- | --- | --- | --- | --- | --- | --- | --- |
| | W0 | W1 | W2 | W3 | S0 | S1 | S2 | S3 | E0 | E1 | E2 | E3 | N0 | N1 | N2 | N3 |
| 0 | 0 | 0 | 0 | 0 | 0 | 0 | 0 | 0 | 0 | 0 | 0 | 0 | 0 | 0 | 0 | 0 |
| 1 | 1 | 0 | 0 | 0 | 0 | 0 | 0 | 0 | 0 | 0 | 0 | 0 | 0 | 0 | 0 | 0 |
| 2 | 1 | 1 | 0 | 0 | 0 | 0 | 0 | 0 | 0 | 0 | 0 | 0 | 0 | 0 | 0 | 0 |
| 3 | 1 | 1 | 1 | 0 | 0 | 0 | 0 | 0 | 0 | 0 | 0 | 0 | 0 | 0 | 0 | 0 |
| 4 | 1 | 1 | 1 | 1 | 0 | 0 | 0 | 0 | 0 | 0 | 0 | 0 | 0 | 0 | 0 | 0 |
| 5 | 1 | 1 | 1 | 1 | 1 | 0 | 0 | 0 | 0 | 0 | 0 | 0 | 0 | 0 | 0 | 0 |
| 6 | 1 | 1 | 1 | 1 | 1 | 1 | 0 | 0 | 0 | 0 | 0 | 0 | 0 | 0 | 0 | 0 |
| 7 | 1 | 1 | 1 | 1 | 1 | 1 | 1 | 0 | 0 | 0 | 0 | 0 | 0 | 0 | 0 | 0 |
| 8 | 1 | 1 | 1 | 1 | 1 | 1 | 1 | 1 | 0 | 0 | 0 | 0 | 0 | 0 | 0 | 0 |
| 9 | 1 | 1 | 1 | 1 | 1 | 1 | 1 | 1 | 1 | 0 | 0 | 0 | 0 | 0 | 0 | 0 |
| 10 | 1 | 1 | 1 | 1 | 1 | 1 | 1 | 1 | 1 | 1 | 0 | 0 | 0 | 0 | 0 | 0 |
| 11 | 1 | 1 | 1 | 1 | 1 | 1 | 1 | 1 | 1 | 1 | 1 | 0 | 0 | 0 | 0 | 0 |
| 12 | 1 | 1 | 1 | 1 | 1 | 1 | 1 | 1 | 1 | 1 | 1 | 1 | 0 | 0 | 0 | 0 |

TABLE 1-continued

| fineint code | W0 | W1 | W2 | W3 | S0 | S1 | S2 | S3 | E0 | E1 | E2 | E3 | N0 | N1 | N2 | N3 |
|---|---|---|---|---|---|---|---|---|---|---|---|---|---|---|---|---|
| 13 | 1 | 1 | 1 | 1 | 1 | 1 | 1 | 1 | 1 | 1 | 1 | 1 | 1 | 0 | 0 | 0 |
| 14 | 1 | 1 | 1 | 1 | 1 | 1 | 1 | 1 | 1 | 1 | 1 | 1 | 1 | 1 | 0 | 0 |
| 15 | 1 | 1 | 1 | 1 | 1 | 1 | 1 | 1 | 1 | 1 | 1 | 1 | 1 | 1 | 1 | 0 |
| 16 | 1 | 1 | 1 | 1 | 1 | 1 | 1 | 1 | 1 | 1 | 1 | 1 | 1 | 1 | 1 | 1 |

As shown in the example set forth in Table 1, as fineint_code increases the decoders activate or fire in a specific sequence. The periodicity in segment selection can result in a degradation of the spectral purity of the RTWO's output clock phases.

In certain implementations herein, an RTWO decoding system is implemented with a dynamic element matching scheme to linearize the fixed sequence. Additionally, the dynamic element matching scheme can increase the period of the fixed sequence and/or remove periodicity altogether.

Figure 6A:
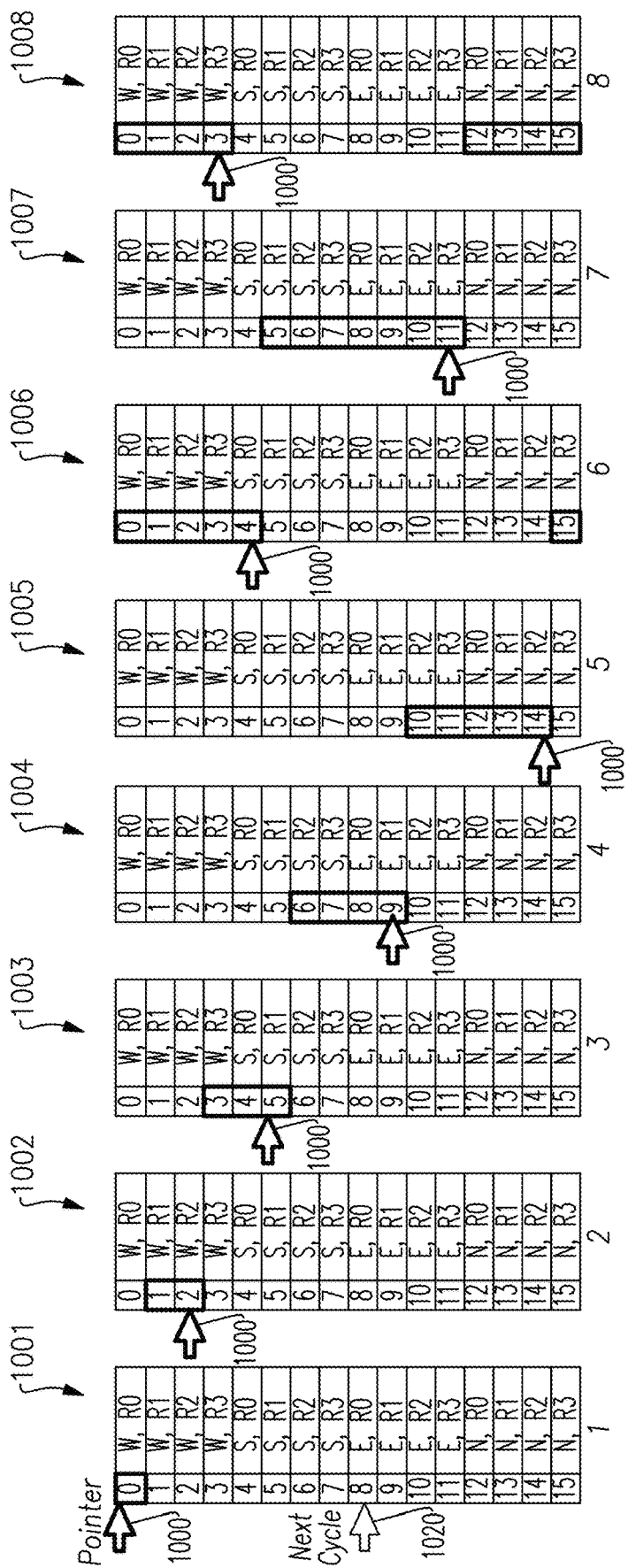
FIGS. 6A and 6B illustrate one implementation of dynamic element matching for segment selection of an RTWO.
Figure 6B:
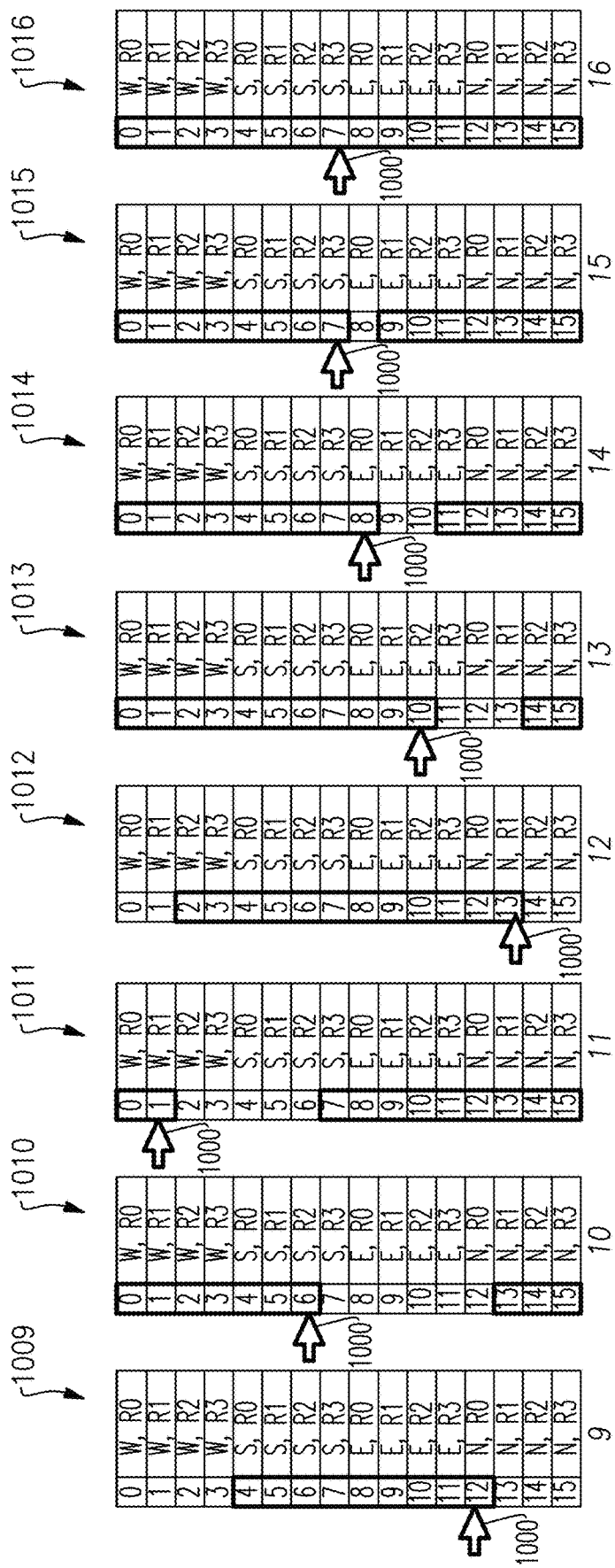

FIGS. 6A and 6B illustrate one implementation of dynamic element matching for segment selection of an RTWO. The dynamic element matching scheme of FIGS. 6A and 6B illustrates one embodiment of dynamic element matching for the multi-ring RTWO 600 of FIG. 5. Thus, the illustrated embodiment of dynamic element matching is used in the context of sixteen tuning decoders, labeled as decoder 0 to decoder 15, respectively.

However, dynamic element matching schemes can be used for a wide variety of RTWOs, including, but not limited to, RTWOs including more or fewer rings, different implementations of rings, more or fewer segments, different implementations of segments, more or fewer tuning decoders, and/or different implementations of tuning decoders.

As shown in FIGS. 6A and 6B, a sequence of a 16-decoder cycle (in this example) is shown, with the sequence of selected decoders labeled as first to sixteenth decoder selections 1001-1016, respectively. The decoder cycle indicates the selection of decoders in response to a ramp up in the fine integer code received by the RTWO. As discussed above, in certain applications, a wide frequency ramp can straddle the full range of fine tuning codes.

A pointer 1000 is used to indicate the last tuning decoder that has been selected. Additionally, a next cycle pointer 1020 indicates a tuning decoder that will be used at the start of a next decoder cycle (16-decoder cycle, in this example). As shown by the first decoder selection 1001, the next cycle pointer 1020 is positioned at a different decoder location than the pointer 1000 is located in the first decoder selection 1001. Implementing the dynamic element matching in this manner reduces periodicity in decoder selection by preventing two consecutive 16-decoder cycles from starting at the same decoder location.

In the illustrated embodiment, the pointer 1000 begins at decoder 0 at the first decoder selection 1001. In certain implementations, if the pointer 1000 has never been set, for instance, at a chip power-up or reset, the pointer 1000 can be set to a particular starting value (for instance, decoder 0) or set to a random or pseudorandom decoder position.

As shown in FIGS. 6A and 6B, the selected decoders change when transitioning from one decoder selection to the next decoder selection. For example, in the illustrated embodiment, the selected decoders in the next decoder selection begin after an end of the decoders of the current decoder selection. Thus, in this embodiment, all previously selected decoders are switched off when transitioning to the next decoder selection.

For example, when transitioning from the first decoder selection 1001 to the second decoder selection 1002, the decoder 0 is turned off and the decoders 1-2 are turned on. Additionally, when transitioning from the second decoder selection 1002 to the third decoder selection 1003, the decoders 1-2 are turned off and the decoders 3-5 are turned on. Furthermore, when transitioning from the third decoder selection 1003 to the fourth decoder selection 1004, the decoders 3-5 are turned off and the decoders 6-9 are turned on. Additionally, when transitioning from the fourth decoder selection 1004 to the fifth decoder selection 1005, the decoders 6-9 are turned off and the decoders 10-14 are turned on.

In the illustrated embodiment, the selected decoders are labeled in a numerical sequence beginning with a starting index 0 and ending with an ending index 15. Additionally, when the ending index is exceeded during decoder selection, the selected decoders wrap to include decoders beginning at the starting index. For example, when transitioning from the fifth decoder selection 1005 to the sixth decoder selection 1006, the decoders 10-14 are turned off and the decoders 15 and 0-4 are turned on.

As shown in the sixth to sixteenth decoder selections 1006-1016, the algorithm repeats until the sixteenth decoder selection 1016, in which all sixteen decoders are selected.

The number of selected decoders can be chosen based on the fine integer code. For example, in this embodiment, mod(fineint_code, 16)+1 can be computed in the case of distributed quantization across four rings. Additionally, fineint_code 0 does not select any decoders, in this example. Accordingly, a result will be a value between 1 to 16.

Depending on the current position of the pointer 1000, the result will select a certain number of decoders from the current pointer location. In one example, the pointer 1000 is located at decoder 5 and fineint_code=200, and mod(200, 16)+1=9, the 9 selected decoders correspond to decoders 6 through 14. Thereafter, the position of the pointer 1000 is located at decoder 14.

Figure 7A:
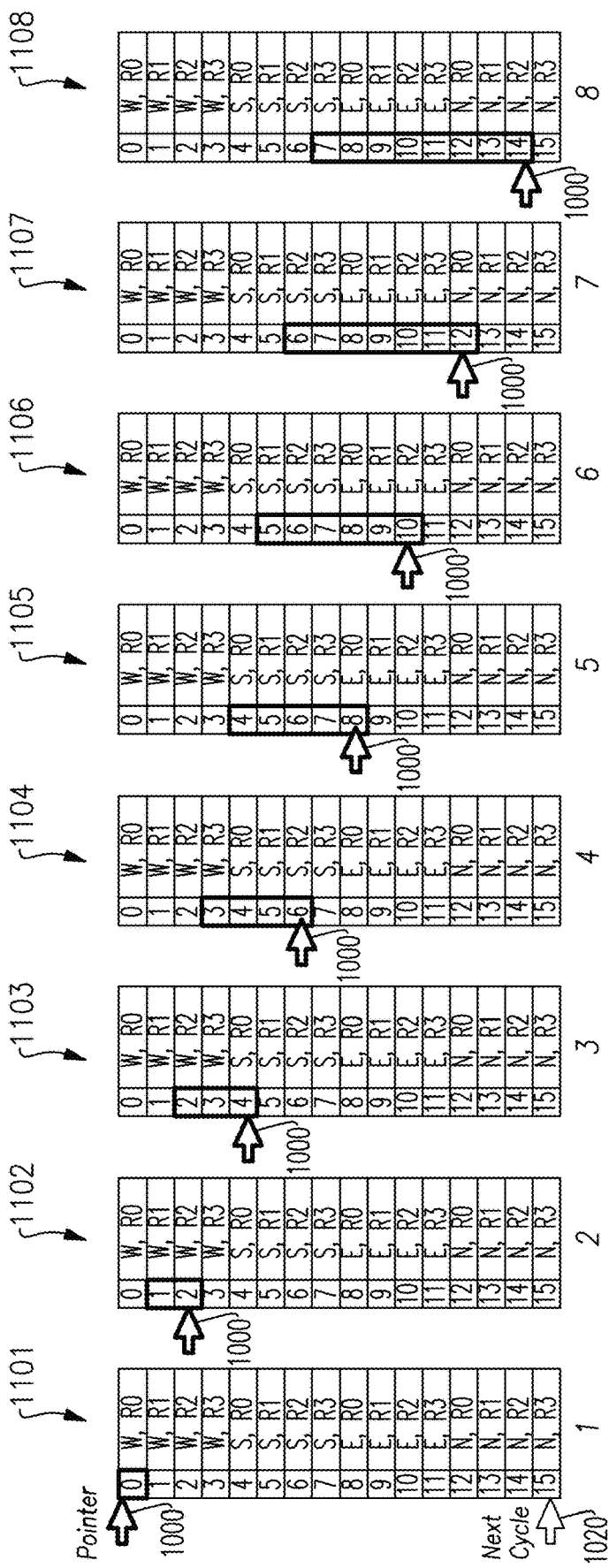
Figure 7B:
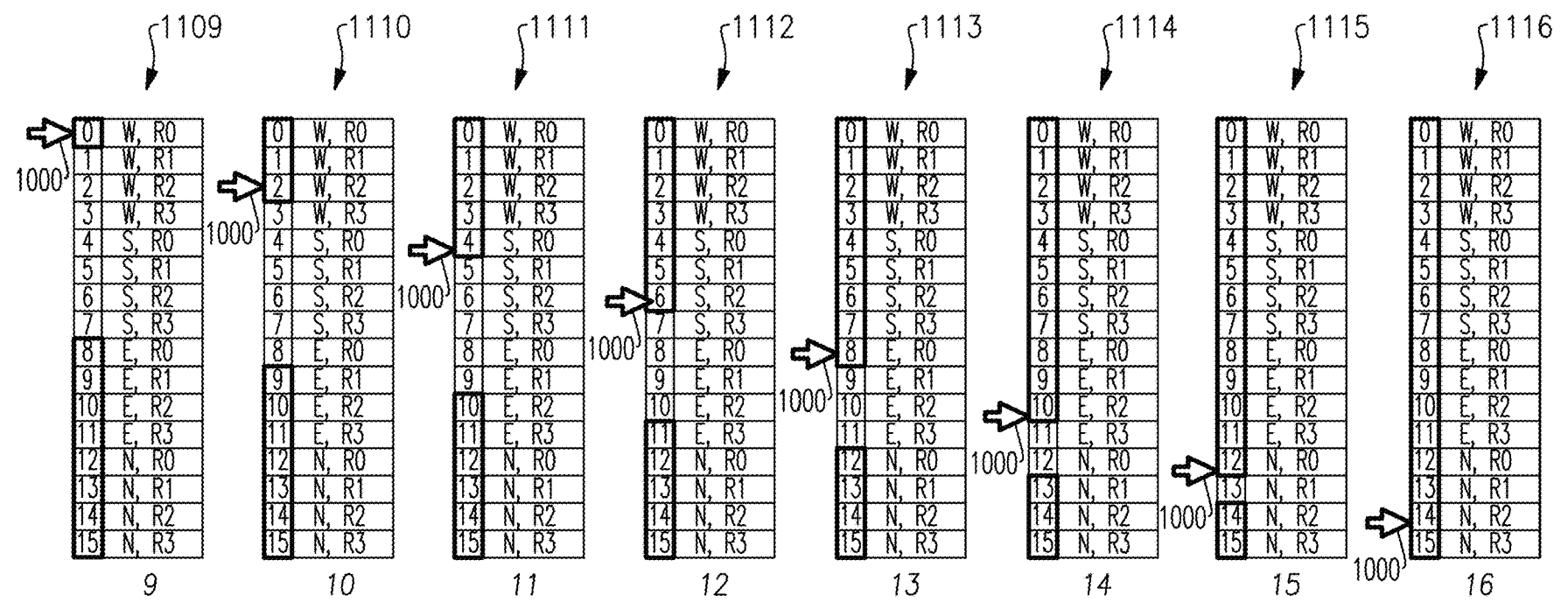

FIGS. 7A and 7B illustrate another implementation of dynamic element matching for segment selection of an RTWO. The implementation of dynamic element matching of FIGS. 7A and 7B is similar to the implementation of dynamic element matching of FIGS. 6A and 6B, except that dynamic element matching of FIGS. 7A and 7B is implemented to turn off only one decoder when transitioning from one decoder selection to the next decoder selection.

For example, when transitioning from the first decoder selection 1101 to the second decoder selection 1102, the decoder 0 is turned off and the decoders 1-2 are turned on. Additionally, when transitioning from the second decoder selection 1102 to the third decoder selection 1103, the decoder 1 is turned off, decoder 2 remains on, and decoders 3-4 are turned on. Furthermore, when transitioning from the third decoder selection 1103 to the fourth decoder selection 1104, the decoder 2 is turned off, decoders 3-4 remain on, and decoders 5-6 are turned on. Additionally, when transitioning from the fourth decoder selection 1104 to the fifth decoder selection 1105, the decoder 3 is tuned off, decoders 4-6 remain on, and decoders 7-8 are turned on.

As shown in the sixth to sixteenth decoder selections 1106-1116, the algorithm repeats until the sixteenth decoder selection 1116, in which all sixteen decoders are selected.

Additional details of the dynamic element matching of FIGS. 7A and 7B can be similar to those described earlier.

The dynamic element matching scheme of FIGS. 6A and 6B and the dynamic element matching scheme of FIGS. 7A and 7B are rotational dynamic element matching schemes. In the example with 16 decoder selections, there are 256 starting possibilities (16*16) for a rotational cycle. Although rotational dynamic element matching schemes reduce periodicity by increasing a length of the period of the fixed sequence, a degree of periodicity nevertheless can remain.

In certain embodiments, a segment decoder system is implemented to operate with a random or pseudorandom dynamic element matching.

For example, in certain embodiments, a pseudorandom binary sequence (PRBS) is used to change the selection sequence of the decoders. The PRBS can be generated in any suitable way, such as using digital logic circuitry.

In one example, the PRBS changes the selection pointer every certain number of codes, for instance, every 16 fine integer codes, every 128 fine integer codes, etc. Thus, an even longer rotational sequence can be achieved to break the periodicity of the decoder selection.

In another example, dynamic element matching is used to randomize the sequence in which segments are selected by a particular tuning decoder. Thus, rather than activating tuning capacitors associated with a particular tuning decoder in a given sequence, the order in which the tuning capacitors controlled by a particular tuning decoder is dynamically selected. Accordingly, dynamic element matching can be used both for breaking the periodicity in the selection of tuning decoders (a tuning decoder sequence) and/or in breaking the periodicity in tuning capacitors selected by the tuning decoders (a segment selection sequence).

Examples of Transition Control Schemes for RTWOs

Apparatus and methods for handling the effects of mismatches in the ON-OFF switching times of controllable capacitors (also referred to herein as varactors) of an RTWO are provided. Controlling the number of varactor transitions that occur on every code enhances the performance of the RTWO, for example, achieving constant transitions versus code when data-weighted DEM is applied to the RTWO's decoders.

For example, in an automotive radar application, frequency ramps are generated by a digital PLL with an RTWO (see, for example, FIG. 1). When DEM is enabled in the RTWO decoder, the number of varactor transitions is a function of input code and any mismatch in the on to off (ON→OFF) and off to on (OFF→ON) switching time of a varactor results in a frequency glitch proportional to the number of varactors switching and hence the input code. This results in a gain error that is a function of input code and a corresponding spur in the baseband spectrum in the target application.

In certain implementations herein, in addition to matching ON→OFF and OFF→ON switching times in layout, constant number of transitions versus code is ensured by creating dummy transitions using spare banks. For example, the number of dummy transitions follow an inverse of the number of transitions versus code, such that the total number of transitions remain constant.

By ensuring a constant number of transitions, performance is enhanced. For example, simulations showed a 100× reduction in the gain variation with a 100 ps ON/OFF mismatch, while measurements show a 20 dB reduction in close-in spur in the baseband spectrum for high speed ramps.

Figures 8A, 8B:
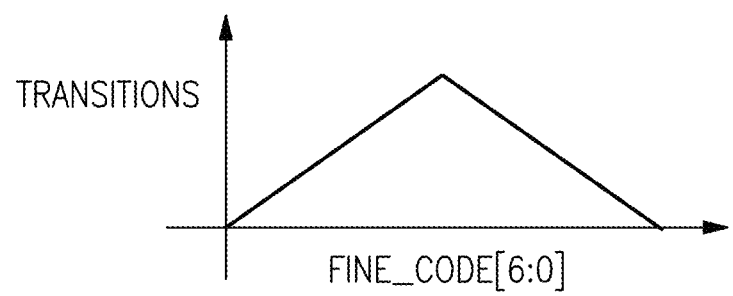
FIG. 8A is a schematic diagram of one embodiment of an RTWO system including four coupled RTWO rings.
FIG. 8B is one example of a graph of transitions versus fine input code for the RTWO system of FIG. 8A.

FIG. 8A is a schematic diagram of one embodiment of an RTWO system 1150 including four coupled RTWO rings. FIG. 8B is a graph of one example of transitions versus fine input code for the RTWO system of FIG. 8A.

In this example, 4 rings are provided, with 4 sides to each ring, 8 segments in each side and 31 varactors in each segment. In particular, the RTWO system 1150 includes a northwest (NW) RTWO ring 1141, a northeast (NE) ring RTWO ring 1142, a southwest (SW) RTWO ring 1143, and a southeast (SE) RTWO ring 1144. In this example, each RTWO ring includes 4 sides with 8 segments per side. Thus, the RTWO system 1150 includes 128 segments (4×4× 8=128). Additionally, each segment includes 128 varactors, with the varactors of one of the segments reserved. Thus, 3968 varactors (128*31=3968) are available for control. Furthermore, the 12-bit fine code is mapped to 3968 control lines. Moreover, DEM is applied to segment selection only on 7 LSBs. Although an RTWO with a specific number of rings, segments, and varactors is provided, the transition control schemes disclosed herein can be applied to a wide variety of RTWOs.

As shown in FIG. 8B, the number of transitions (0→1 and 1→0) is code dependent when transition control is not provided.

Figure 8C:
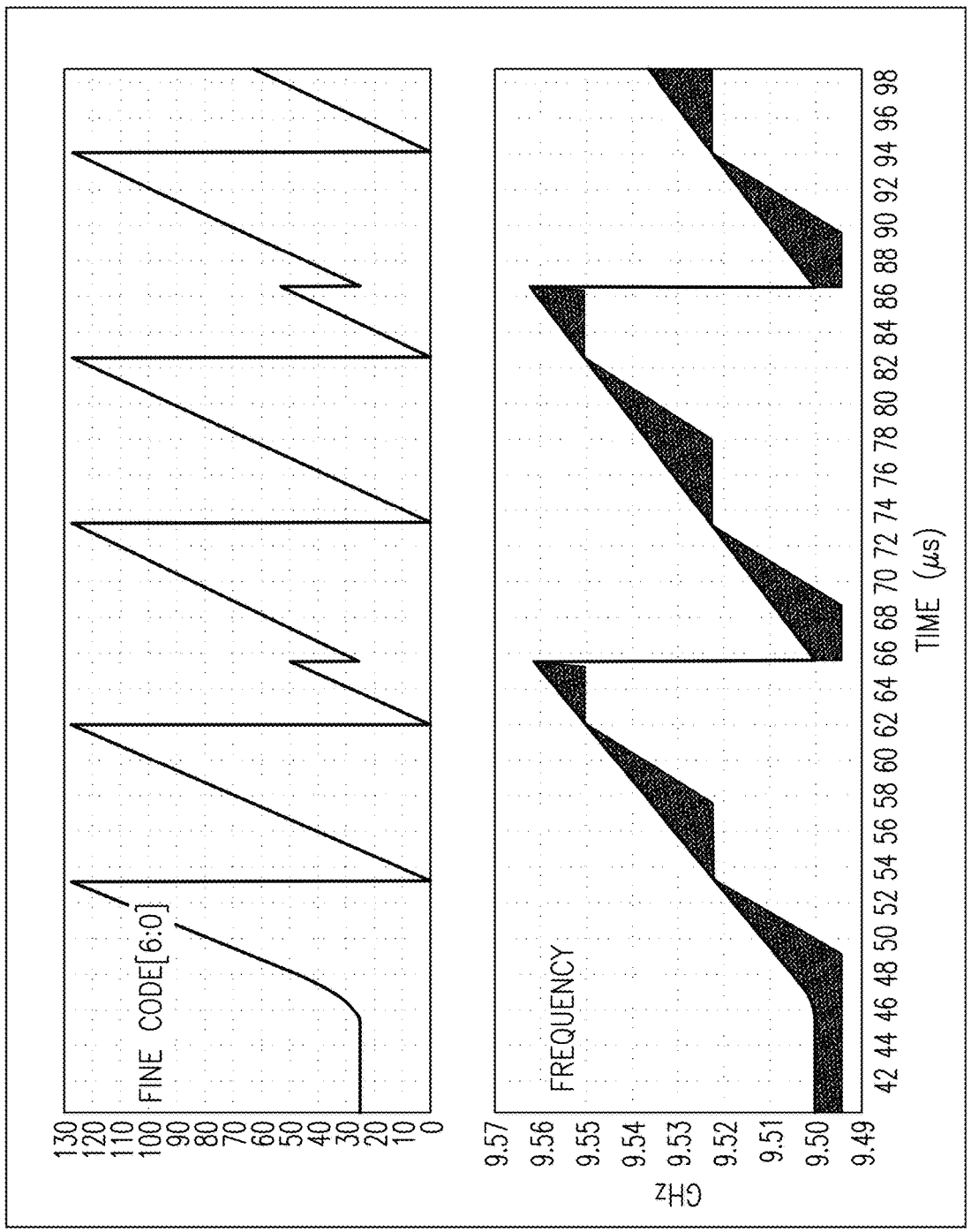
FIG. 8C is a graph of one example of switching time mismatch for the RTWO system of FIG. 8A.

FIG. 8C is a graph of one example of switching time mismatch for the RTWO system 1150 of FIG. 8A. The graph includes an upper plot of fine code value versus time and a bottom plot of frequency versus time.

With respect to the simulation of FIG. 8C, a 100 ps mismatch is added to the ON/OFF switching times of the varactors. DEM results in frequency glitches whose magnitude is a function of number of transitions. This results in a code dependent gain error.

Figure 8D:
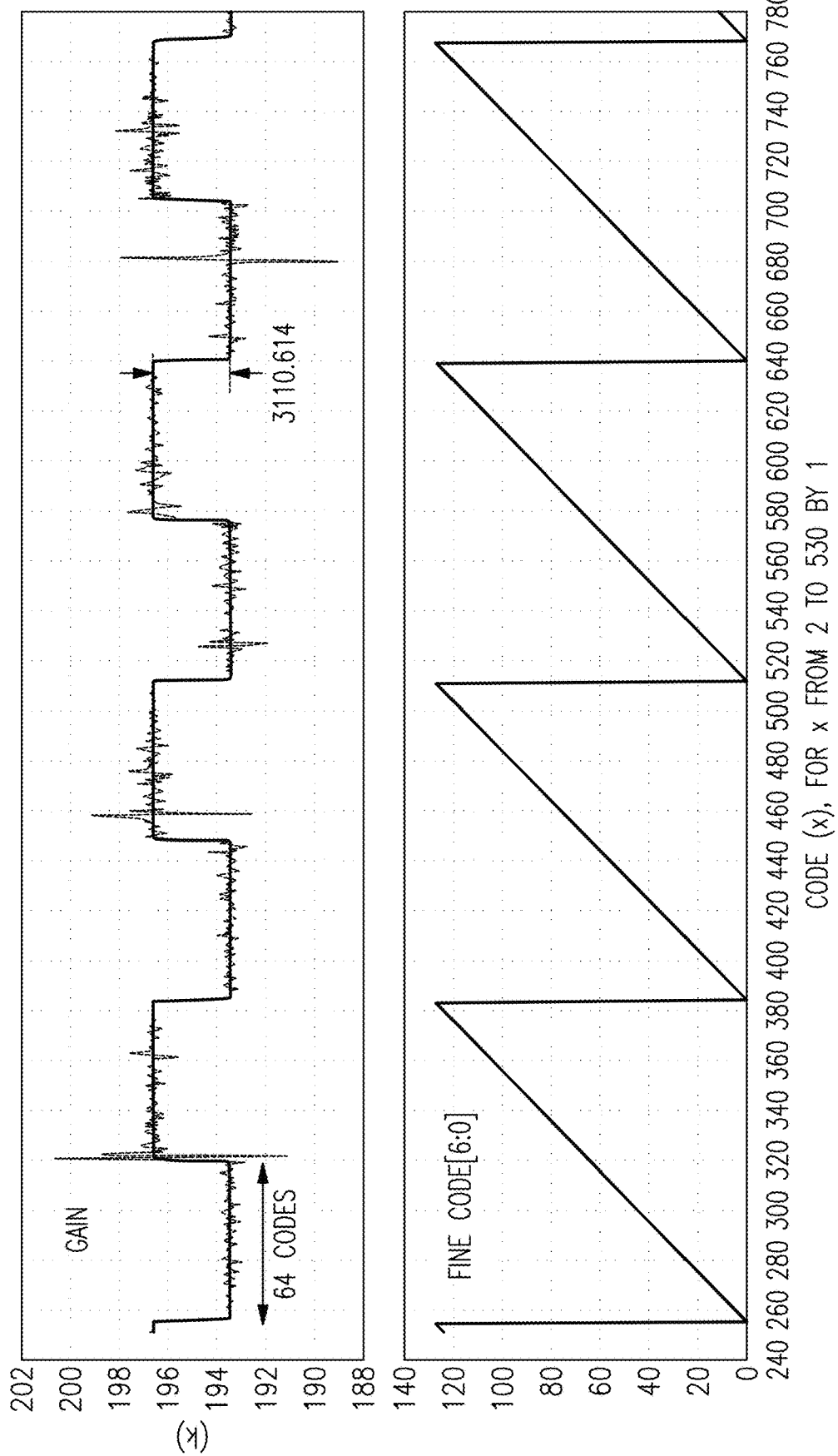
FIG. 8D is a graph of one example of gain errors for the RTWO system of FIG. 8A.

FIG. 8D is a graph of one example of gain errors for the RTWO system of FIG. 8A. The graph includes an upper plot of gain versus total code, and a bottom plot of fine code versus total code for a frequency ramp.

With respect to FIG. 8D, there is a step in gain every 64 codes because of unequal transition density. For first 64 codes, the glitch count increases as the code increases and for the next 64 codes the glitch count decreases with code. Varactor gain mismatches are disabled, and only switching time mismatches are modelled in this example.

To overcome the issues of FIGS. 8A-8D, transition controlled DEM can be used to match the number of transitions per code in accordance with the teaching herein.

For example, in the context of the RTWO system of FIG. 8A, 2 varactors out of 31 (labeled var0 through var30, respectively) in each segment can be assigned for transition control. Thus, 128 segments*2 per segment=256 varactors in total can be used for transition control in this specific example. Var29 (spare bank 0) and Var30 (spare bank 1) in each segment are set aside for transition control. Half of them are switched ON at the start. Depending on the code, varactors from the spare banks are toggled such that there are 64 0→1 and 64 1→0 transitions are provided in total. Same logic can be used to control both the spare banks to save area.

Thus, in an example for code 2, (64-2) 62 extra transitions are obtained by toggling 31 Var29 plus 31 Var30. Additionally, in an example for code 3, (64-3) 61 extra transitions are obtained by alternatively toggling 30 Var29 plus 30 Var30 and 31 Var29 plus 31 var30 so that 61 total transitions occur on average. Furthermore, in these examples, the spare banks always have exactly 64 var29 and 64 Var30 turned ON.

Accordingly, constant total number of varactors switched in achieves constant offset frequency to a first order.

Although an example with specific number of varactors, spare varactors, and segments is provided, the teachings herein are applicable to RTWOs implemented in a wide variety of ways.

Figure 8E:
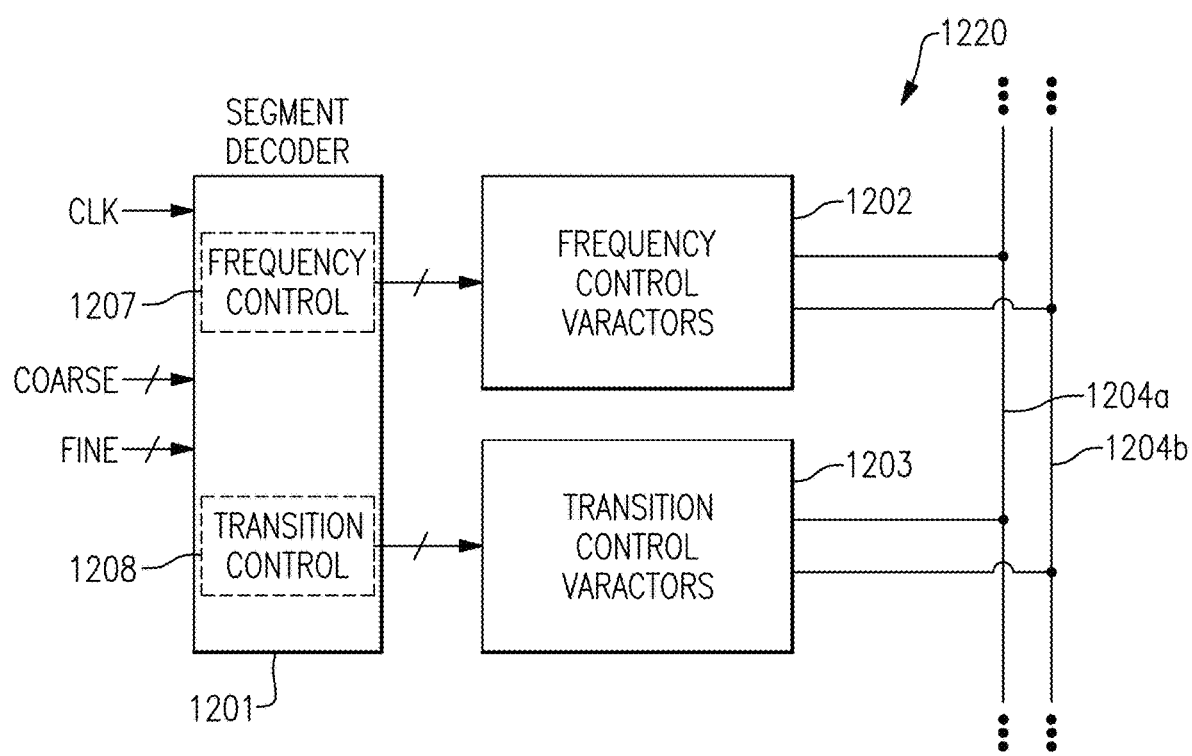
FIG. 8E is a schematic diagram of varactor circuitry for an RTWO segment according to one embodiment.

FIG. 8E is a schematic diagram of varactor circuitry for an RTWO segment 1220 according to one embodiment. The RTWO segment 1220 includes a segment decoder 1201, frequency control varactors 1202, and transition control varactors 1203. As shown in FIG. 8E, the frequency control varactors 1202 and the transition control varactors 1203 are each connected between a differential transmission line 1204a/1204b of an RTWO. Each of the varactors of the frequency control varactors 1202 and each of the varactors of the transition control varactors 1203 are individually selectable to control a capacitive loading of the differential transmission line 1204a/1204b.

As shown in FIG. 8E, the segment decoder 1201 receives a coarse frequency control signal (COARSE) and a fine frequency control signal (FINE). Additionally, the segment decoder 1201 includes a frequency control decoder 1207 that controls the frequency control varactors 1202 based on the coarse tuning code and the fine tuning code. Furthermore, the segment decoder 1202 includes a transition control decoder 1208 that controls the transition control varactors 1203 based on the fine tuning code to compensate the frequency control decoder 1207 for a difference in transition density versus the fine tuning code.

For example, in certain embodiments, the transition control decoder 1208 chooses a number of varactors of the transition control varactors 1203 that transition in state based on a value of the fine tuning code. In particular, the transition control decoder 1208 chooses a number of varactors that are selected from the transition control varactors 1203 to ensure that a sum of a number of transitions provided by the transition control decoder 1201 and a number of transitions provided by the frequency control decoder 1207 is constant for each value of the fine tuning code.

In certain implementations, the segment decoder 1201 in controlled by a clock signal CLK, and the transition control decoder 1208 updates the number of transition control varactors 1203 that are selected each cycle of the clock signal CLK. Additionally, when the frequency tuning code is fixed at a given value (the coarse tuning code and fine tuning code are both constant), a total number of varactors in the selected state is constant but a particular selection of the transition control varactors 1203 changes each cycle of the clock signal CLK.

Thus, as dynamic element matching occurs with a fixed frequency tuning code, transition control maintains the total number of varactors that transition from 0→1 and from 1→0 constant from one clock cycle to the next. Accordingly, code dependent frequency errors are mitigated.

Figure 9:
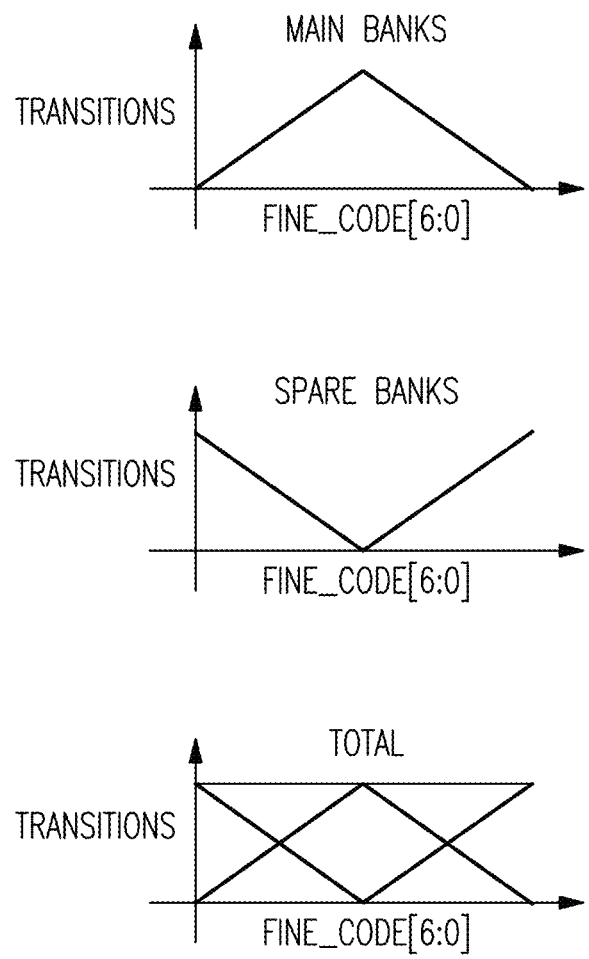
FIG. 9 is a graph of one example of transitions for transition controlled dynamic element matching (DEM).

FIG. 9 is a graph of one example of transitions for transition controlled DEM. As shown in the tope plot of FIG. 9, DEM has a triangular shape of transitions versus fine code as discussed earlier with respect to FIG. 8B. Additionally, as shown in the middle plot of FIG. 9, the spare banks are implemented with an inverted triangular shape of transitions versus fine code to compensate for the transitions of the main banks used for DEM. Accordingly, as shown in the bottom plot of FIG. 9, the total number of transitions versus fine code is substantially constant.

FIG. 10 is one example of an operational diagram for spare banks for transition controlled DEM. In this example, OFF to ON transitions are indicated with bolded arrows pointing up, while ON to OFF transitions are indicated with bolded arrows pointing down.

As shown in FIG. 10, the number of varactors transitioned for the spare banks is a function of input code, and selected such that the total number of transitions for the RTWO system versus fine code is substantially constant.

Figure 11:
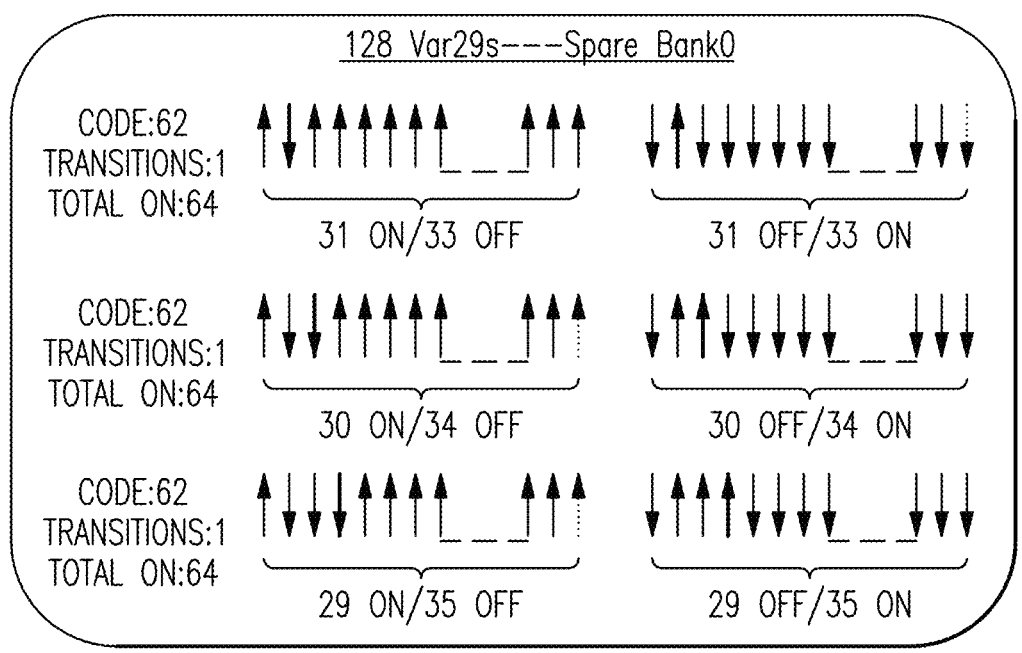
FIG. 11 is one example of operation of a transition control bank.

FIG. 11 is one example of operation of a transition control bank.

As shown in FIG. 11, the varactors are used to maintain the transition density are also rotated using a DEM scheme. Thus, the varactors that toggle are rotated on every clock cycle (shown in bolded arrows in the figure). Furthermore, the spare bank always has exactly 64 varactors turned ON in this example. Moreover, the transitions complement those coming from DEM on the main banks.

Figure 12A:
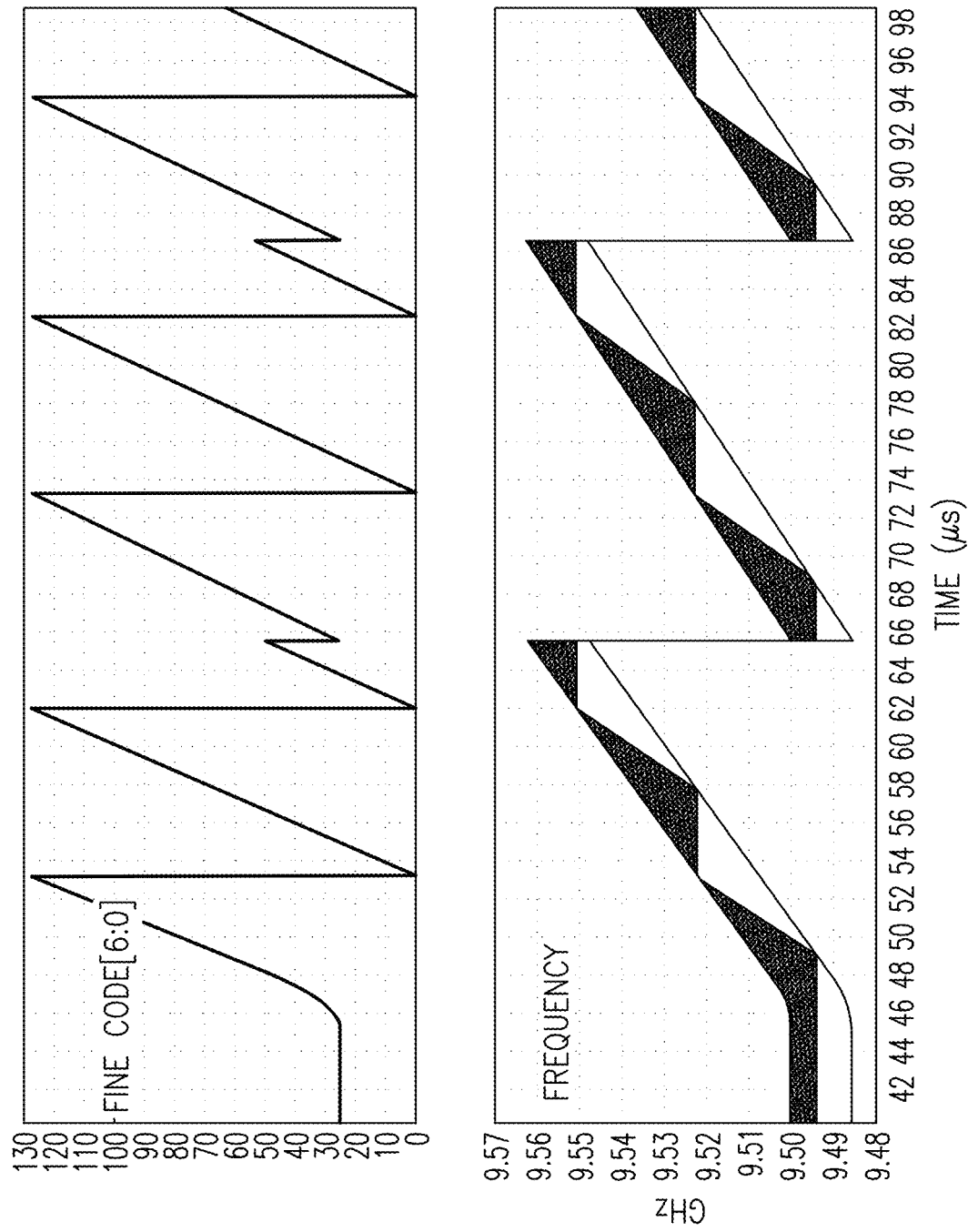
FIG. 12A is a graph of one example of switching time mismatch for an RTWO system with transition control.

FIG. 12A is a graph of one example of switching time mismatch for an RTWO system with transition control. The graph includes an upper plot of fine code value versus time and a bottom plot of frequency versus time.

In the illustrated example, a 100 ps mismatch is added to the ON/OFF switching times of the varactors. DEM plus transition control results in constant transitions. This results in a code independent gain error.

Figure 12B:
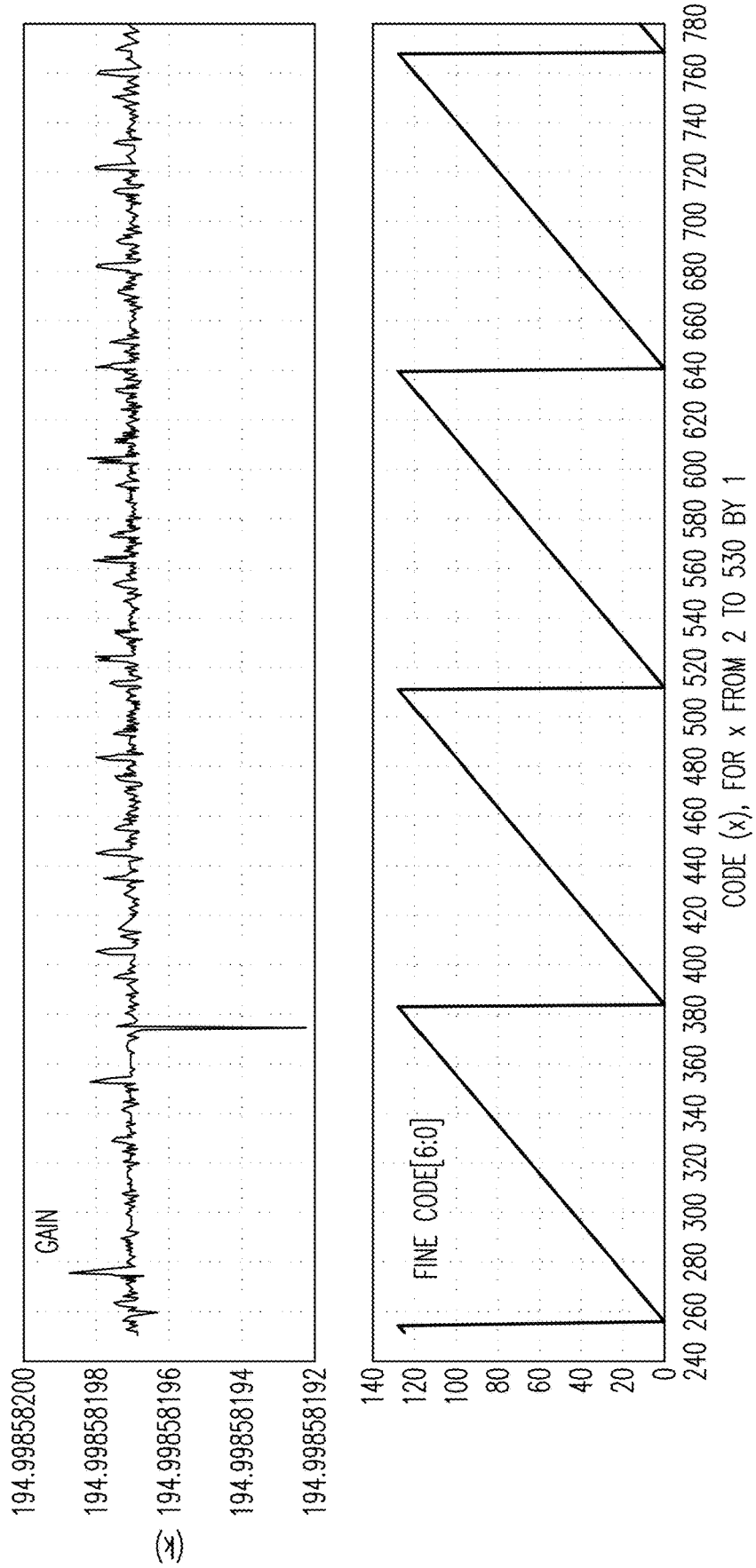
FIG. 12B is a graph of one example of gain errors for an RTWO system with transition control.

FIG. 12B is a graph of one example of gain errors for an RTWO system with transition control.

As shown by a comparison of FIG. 12B and FIG. 8D, the step in gain every 64 codes is now gone.

In particular, transition density is constant, and the error due to glitch frequency is the same for all codes.

In this example, varactor gain mismatches are disabled. Only switching time mismatches are modelled.

Figure 13A:
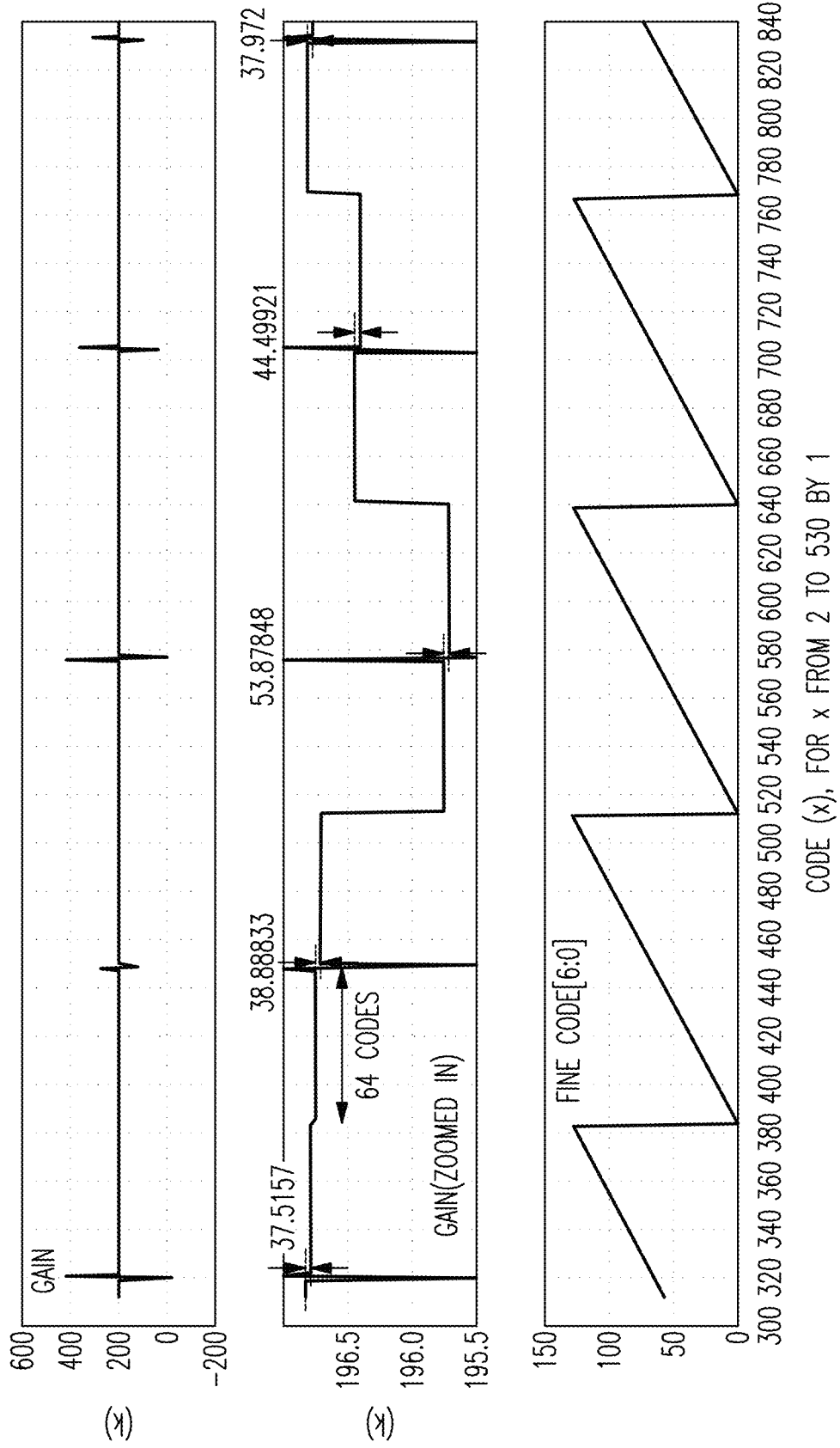
FIG. 13A is a graph of another example of gain errors for an RTWO system with transition control in which varactor gain mismatch is also modeled.

FIG. 13A is a graph of another example of gain errors for an RTWO system with transition control in which varactor gain mismatch is also modelled. The graph includes a top plot of gain error versus total code, a middle plot of zoomed-in gain error versus total code, and a bottom plot of fine code versus total code for a frequency ramp.

Varactor gain mismatches are now modelled in this example. As shown in FIG. 13A, there is a big glitch on code 64. Additionally, there is a small difference in the gains for the lower and upper 64 codes.

Figure 13B:
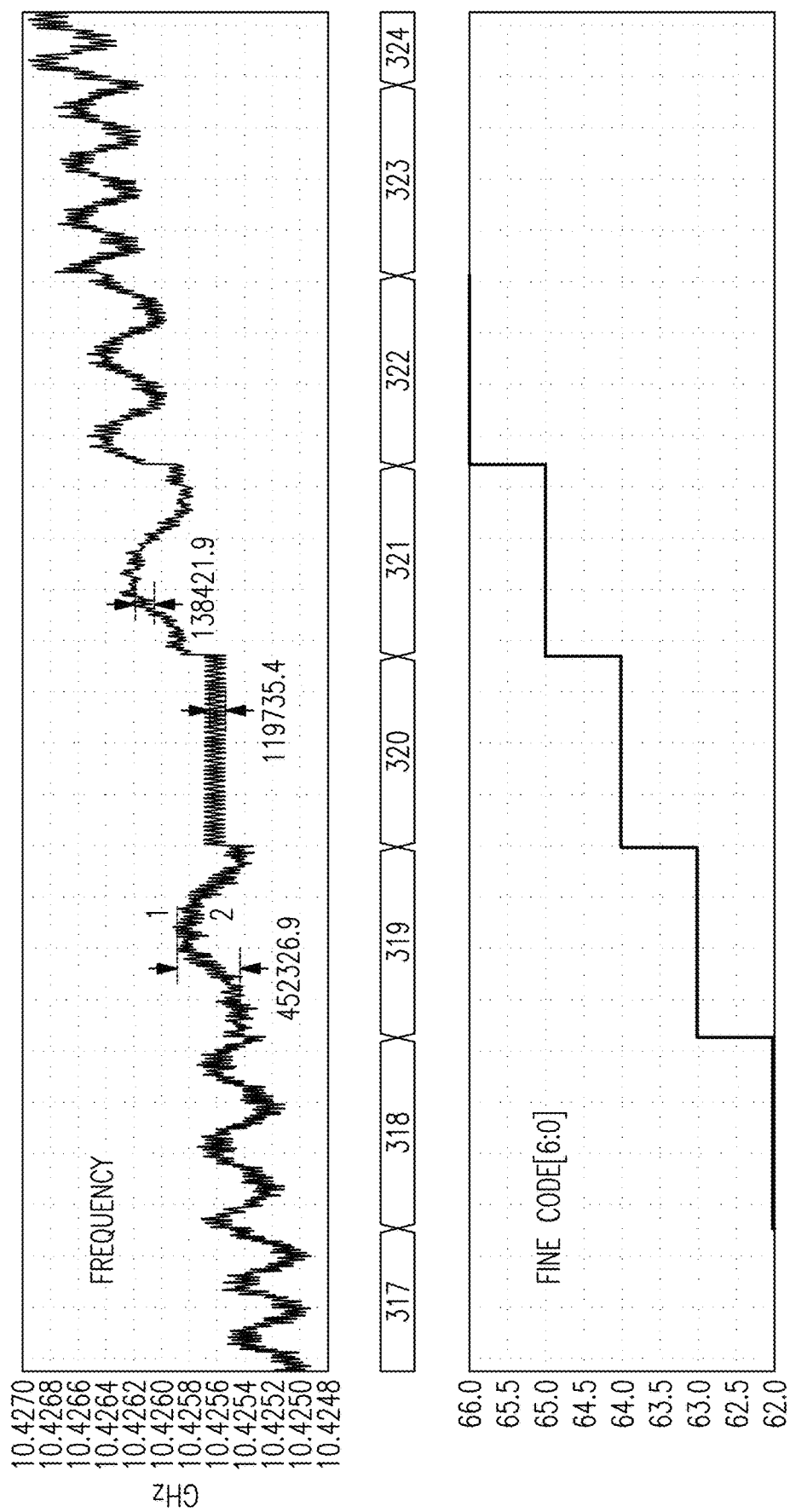
FIG. 13B is a graph of another example of gain mismatch with transition control.

FIG. 13B is a graph of another example of gain mismatch with transition control.

When transition control is enabled, 128 varactors switched ON in the spare banks result in a frequency offset. This offset changes on every clock cycle as a different set of varactors contribute to this offset with the DEM in transition control. Additionally, for code[6:0]=64 there are no transitions in the spare bank and hence the offset is constant resulting in the glitch in the gain at this code.

In certain embodiments, modified transition control is provided herein to overcome the issues associated with FIGS. 13A and 13B in which varactor gain mismatch is also accounted for.

In a first aspect of modified transition control, the inventors have recognized that varactor gain varies significantly across the segments compared to the variation within a segment. Accordingly, by making the two spare banks inverse of the each other, the spread in the offset frequency can be greatly reduced.

In a second aspect, non-zero spare bank transitions are ensured on each code by making the total transitions having a larger number, for instance, 66 instead of 64.

Figure 14A:
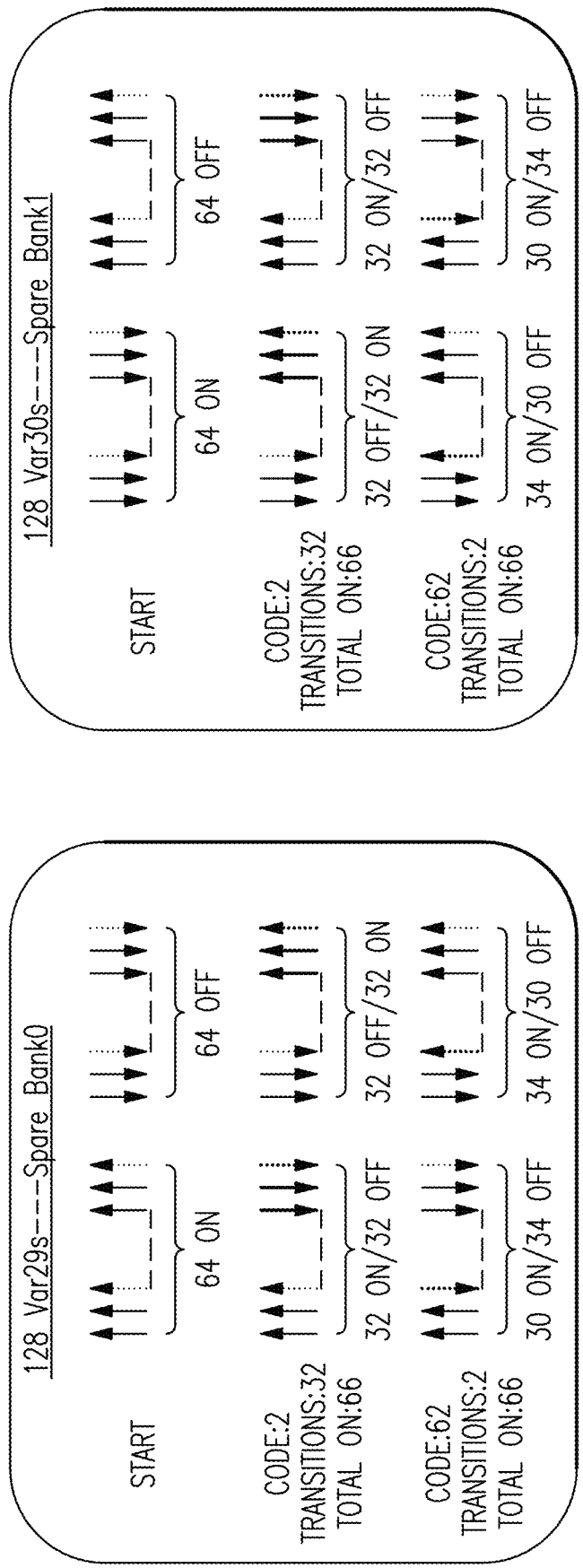
FIG. 14A is another example of an operational diagram for spare banks for transition controlled DEM.

FIG. 14A is another example of an operational diagram for spare banks for transition controlled DEM. The diagram corresponds to an example of modified transition control with 66 transitions rather than 64 as discussed previously.

Figure 14B:
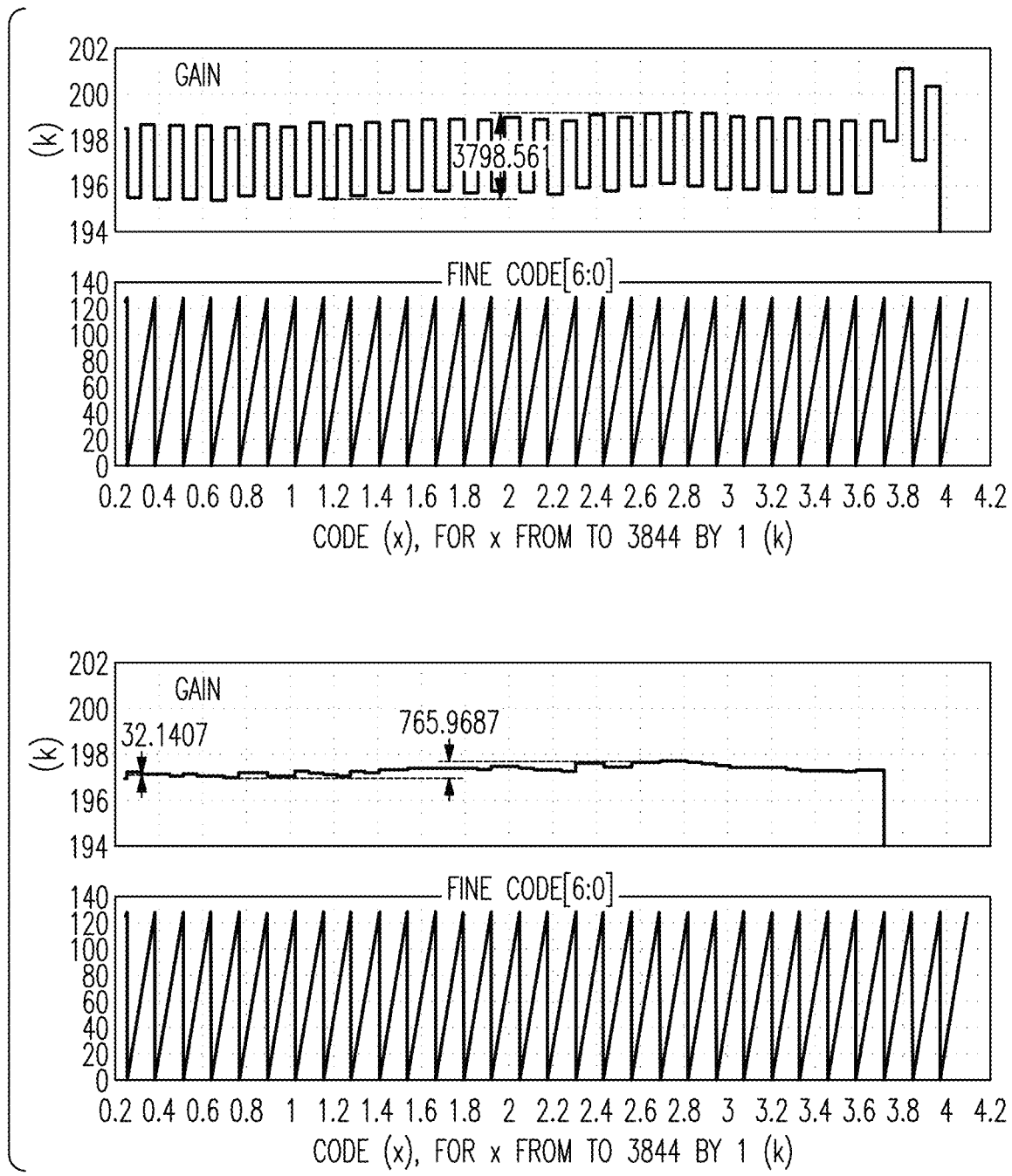
FIG. 14B is a graph of one example of open-loop gain with switching time and gain mismatch modeled.

FIG. 14B is a graph of one example of open-loop gain with switching time and gain mismatch modeled.

In this example, gain error every 64 codes is reduced from 3.2 kHz to ~30 Hz.

Figure 15A:
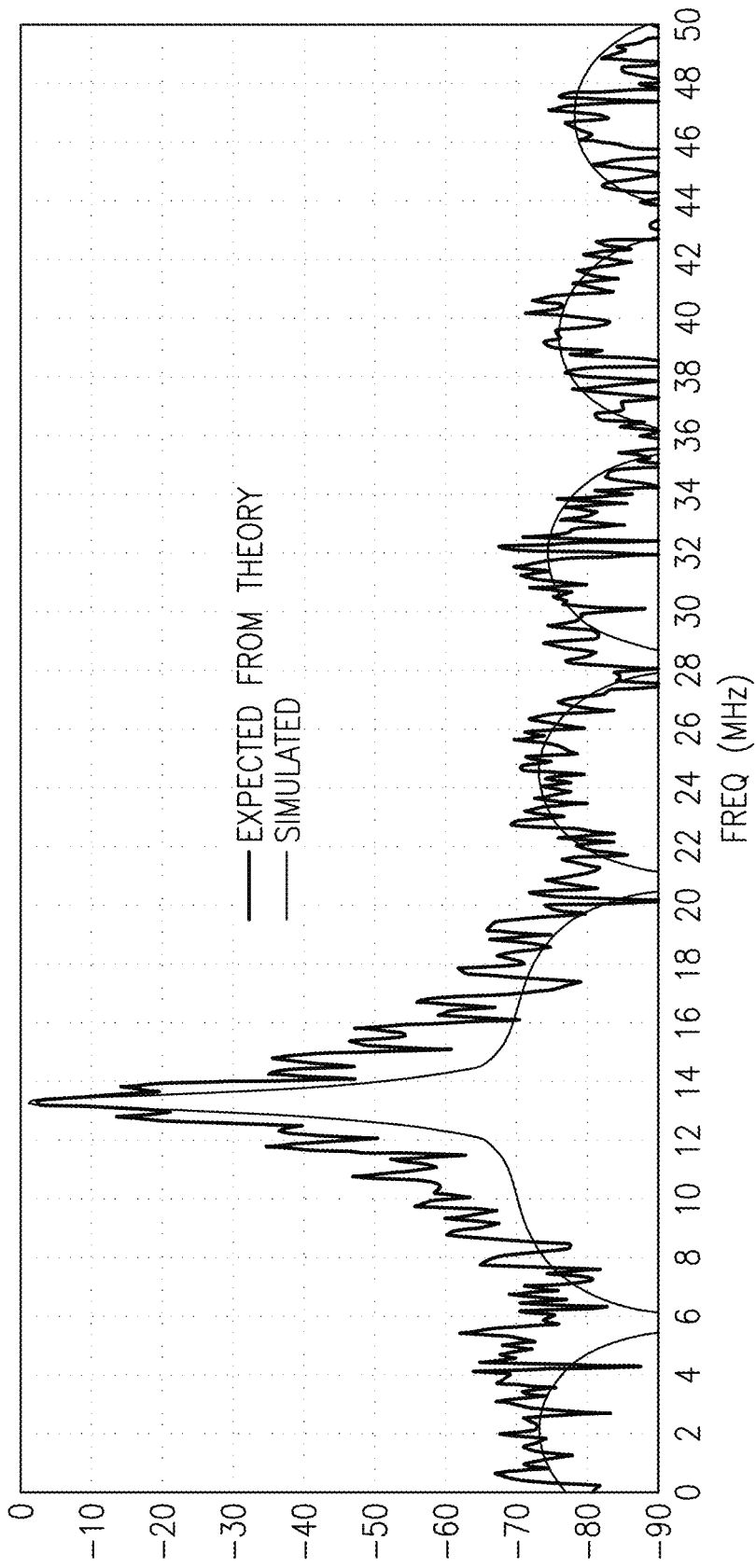
FIG. 15A is a graph of one example of simulated baseband plots.

FIG. 15A is a graph of one example of simulated baseband plots.

In FIG. 15A, transition control is disabled. Gain mismatch and switching time mismatch are modeled.

Figure 15B:
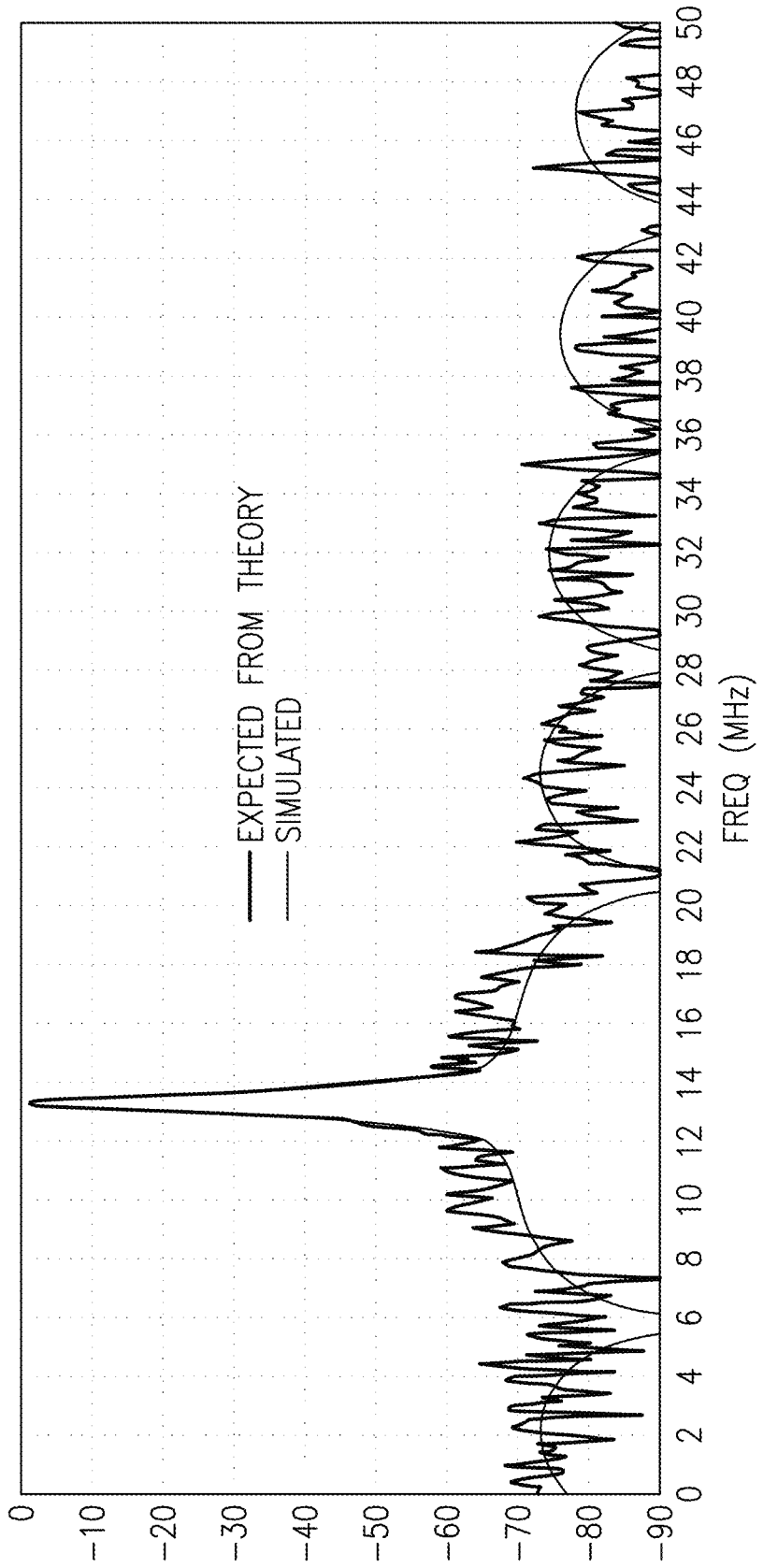
FIG. 15B is a graph of another example of simulated baseband plots.

FIG. 15B is a graph of another example of simulated baseband plots.

In FIG. 15B, transition control is enabled. Gain mismatch and switching time mismatch are modeled.

Figure 16:
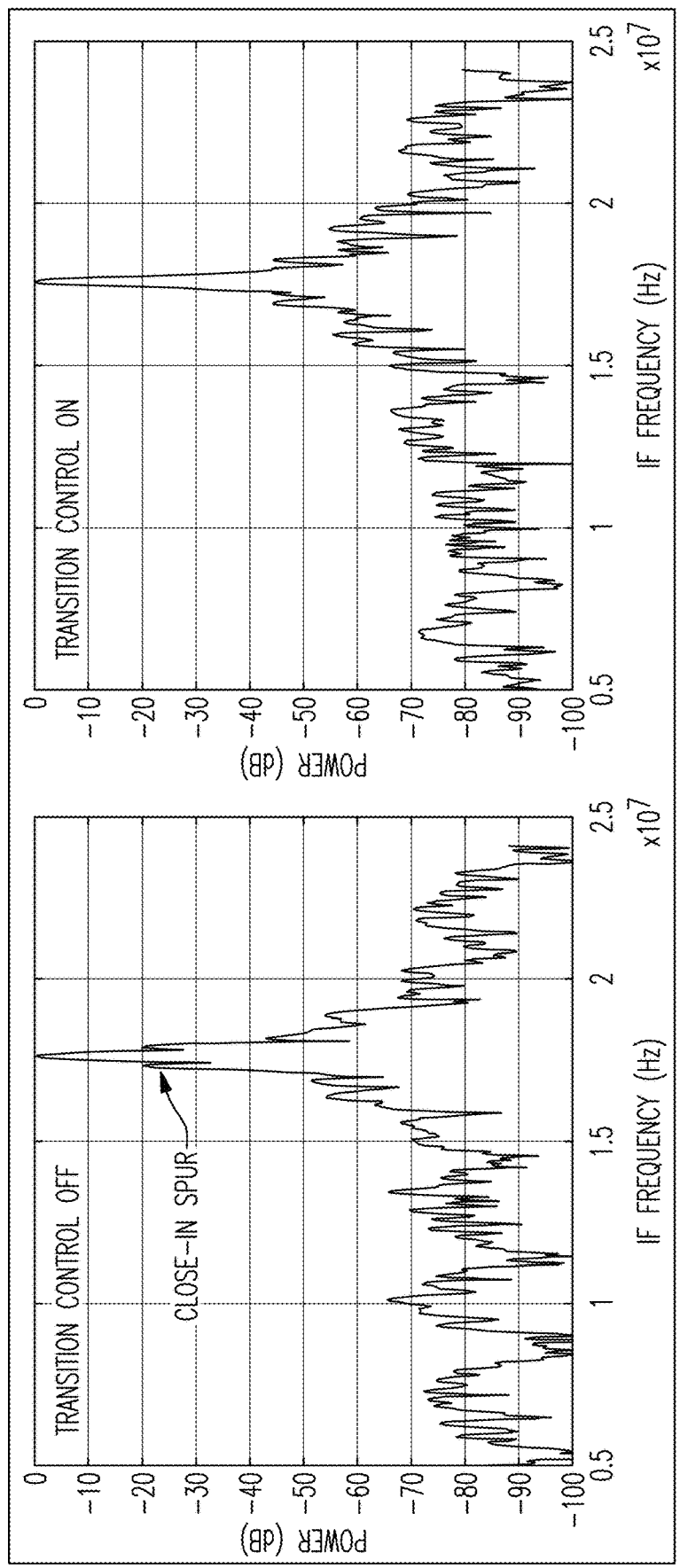
FIG. 16 is a graph of measured baseband plots with and without transition control.

FIG. 16 is a graph of measured baseband plots with and without transition control.

Switching time mismatches in the ON/OFF paths of the varactors result in periodic gain errors and degrade the baseband performance.

By making the switching density independent of code, sidelobe level is reduced by ~20 dB in measurements.

Applications

Devices employing RTWOs including one or more of the above-described features can be implemented into various electronic devices. Examples of the electronic devices can include, but are not limited to, consumer electronic products, parts of the consumer electronic products, electronic test equipment, radar systems, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention.

Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A rotary traveling wave oscillator (RTWO) system comprising:
   a first RTWO ring configured to carry a traveling wave;
   a plurality of selectable capacitors distributed around the first RTWO ring, wherein each of the plurality of selectable capacitors is operable in a selected state and an unselected state; and
   a decoder system configured to control selection of the plurality of selectable capacitors based on a frequency tuning code including a fine tuning code and a coarse tuning code, wherein the decoder system is configured to maintain a constant number of capacitors that toggle state for each value of the fine tuning code.

2. The RTWO system of claim 1, wherein the decoder system includes a transition control decoder configured to control a first portion of the plurality of selectable capacitors, wherein the transition control decoder is configured to choose a number of capacitors in the first portion that transition in state based on a value of the fine tuning code.

3. The RTWO system of claim 2, wherein the transition control decoder operates a constant number of capacitors in the selected state for each value of the fine tuning code.

4. The RTWO system of claim 2, wherein the decoder system further includes a frequency control decoder configured to control a second portion of the plurality of selectable capacitors based on the fine tuning code, wherein the transition control decoder compensates the frequency control decoder for a difference in transition density versus the fine tuning code.

5. The RTWO system of claim 4, wherein a sum of a first number of transitions provided by the transition control decoder and a second number of transitions provided by the frequency control decoder is constant for each value of the fine tuning code.

6. The RTWO system of claim 2, wherein the transition control decoder selects a group of capacitors for transition control for a given value of the fine tuning code.

7. The RTWO system of claim 6, wherein the transition control decoder is control by a clock signal, wherein the selected group of capacitors for transition control changes each cycle of the clock signal.

8. The RTWO system of claim 7, wherein the selected group of capacitors for transition control rotates.

9. The RTWO system of claim 6, wherein the transition control decoder is implemented to provide at least one transition for each value of the fine tuning code.

10. The RTWO system of claim 1, wherein the decoder system in controlled by a clock signal, wherein when the frequency tuning code is fixed at a given value, a total number of capacitors in the selected state is constant but a particular selection of the plurality of selectable capacitors changes each cycle of the clock signal.

11. The RTWO system of claim 1, further comprising a second RTWO ring coupled to the first RTWO ring.

12. A method of rotary traveling wave oscillation, the method comprising:
   propagating a travelling wave around an RTWO ring;
   controlling a delay of the travelling wave around the RTWO ring using a plurality of selectable capacitors distributed around the first RTWO ring, wherein each of the plurality of selectable capacitors is operable in a selected state and an unselected state;

controlling selection of the plurality of selectable capacitors based on a frequency tuning code using a decoder system, wherein the frequency tuning code includes a fine tuning code and a coarse tuning code; and maintaining a constant number of capacitors of the plurality of selectable capacitors that toggle state for each value of the fine tuning code using the decoder system.

13. The method of claim 12, wherein the decoder system includes a transition control decoder configured to control a first portion of the plurality of selectable capacitors, the method further comprising choosing a number of capacitors in the first portion that transition in state based on a value of the fine tuning code.

14. The method of claim 13, further comprising operating a constant number of capacitors in the selected state for each value of the fine tuning code.

15. The method of claim 13, wherein the decoder system further includes a frequency control decoder configured to control a second portion of the plurality of selectable capacitors based on the fine tuning code, the method further comprising using the transition control decoder to compensate the frequency control decoder for a difference in transition density versus the fine tuning code.

16. The method of claim 15, wherein a sum of a first number of transitions provided by the transition control decoder and a second number of transitions provided by the frequency control decoder is constant for each value of the fine tuning code.

17. The method of claim 13, further comprising using the transition control decoder to select a group of capacitors for transition control for a given value of the fine tuning code.

18. The method of claim 17, wherein the transition control decoder is control by a clock signal, the method further comprising changing the selected group of capacitors for transition control each cycle of the clock signal.

19. The method of claim 18, further comprising using the transition control decoder to provide at least one transition for each value of the fine tuning code.

20. A rotary traveling wave oscillator (RTWO) system comprising:

an RTWO ring configured to carry a traveling wave;

a plurality of selectable capacitors distributed around the RTWO ring, wherein each of the plurality of selectable capacitors is operable in a selected state and an unselected state; and a decoder system configured to control selection of the plurality of selectable capacitors based on a frequency tuning code including a fine tuning code and a coarse tuning code, wherein the decoder system comprises means for maintaining a constant number of capacitors that toggle state for each value of the fine tuning code.

* * * * *